United States Patent [19]

Roberts et al.

[11] Patent Number: 4,481,625
[45] Date of Patent: Nov. 6, 1984

[54] HIGH SPEED DATA BUS SYSTEM

[75] Inventors: Allen W. Roberts, Union City; Harold L. McFarland, Jr., Santa Clara; Harlan Lau, Campbell, all of Calif.

[73] Assignee: Elxsi, San Jose, Calif.

[21] Appl. No.: 313,524

[22] Filed: Oct. 21, 1981

[51] Int. Cl.³ .............................................. H04J 3/12
[52] U.S. Cl. ...................................... 370/85; 370/92; 370/110.1
[58] Field of Search .................. 370/94, 92, 85, 89, 370/110.1; 364/200, 900

[56] References Cited

U.S. PATENT DOCUMENTS 3,787,627 1/1974 Abramson et al. ................. 370/89
4,236,245 11/1980 Freeny et al. ....................... 370/94
4,354,263 10/1982 Bordry et al. ....................... 370/94

FOREIGN PATENT DOCUMENTS 0102818 8/1979 Japan ................................. 370/94

Primary Examiner—Douglas W. Olms
Attorney, Agent, or Firm—Townsend and Townsend

[57] ABSTRACT

In a high speed data bus system, each functional unit has an associated port which operates to accept all related information that makes up a communication, or if this cannot be done, to accept none of the information. More particularly, an information transfer, depending on its nature, may comprise one BIQ or more than one BIQ (a "BIQ" is a bus information quantum which is placed on the bus for one bus cycle). To implement the indivisibility of multiple-BIQ transfers, the control logic for each port includes screening circuitry responsive to the state of the port's input buffers, and further responsive to flags from the functional unit for selectively accepting or rejecting BIQ's, and further includes screening constraint circuitry to ensure that the port accepts all or none of the BIQ's that make up the transfer. Depending on the flag, the rejection may be total, or may apply only to a designated class of transfers (for example, operations).

31 Claims, 31 Drawing Figures

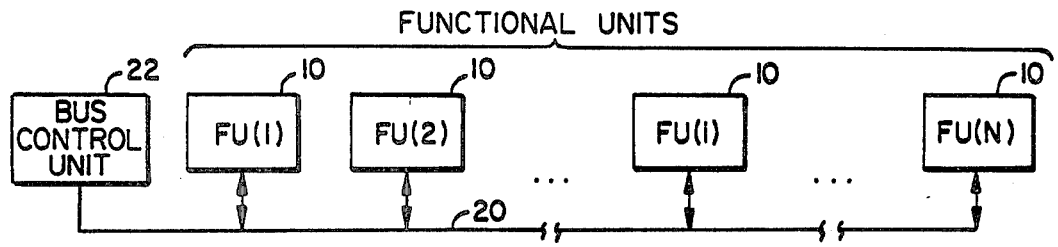
FIG.—1.
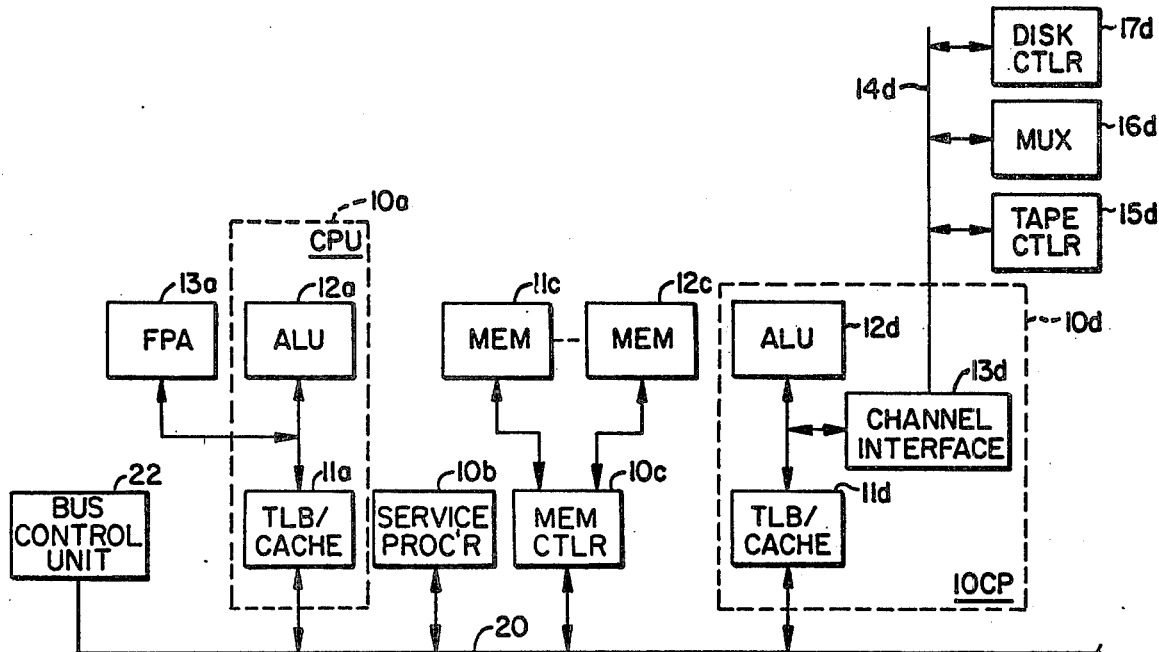
FIG.—2.
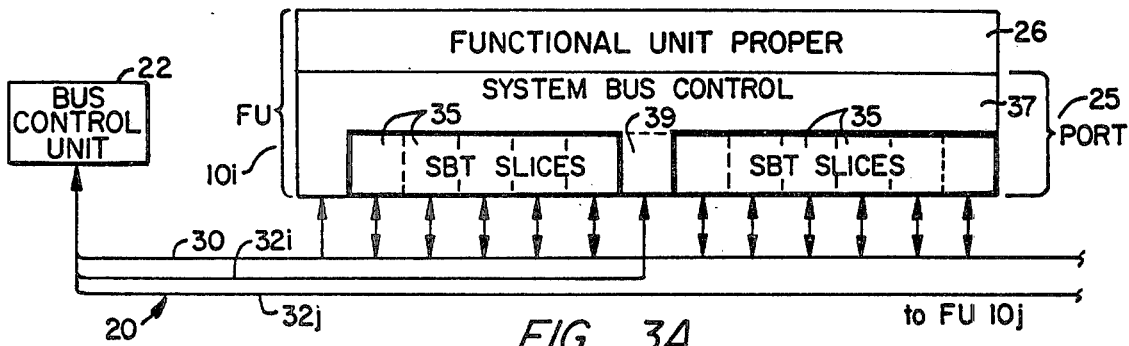
FIG.—3A.
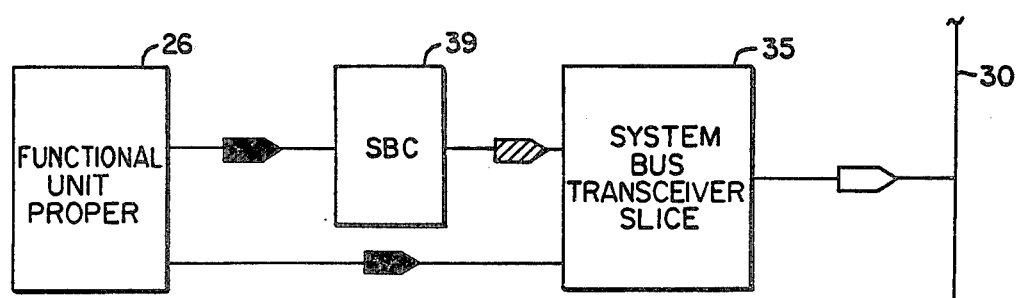
FIG.—3B.

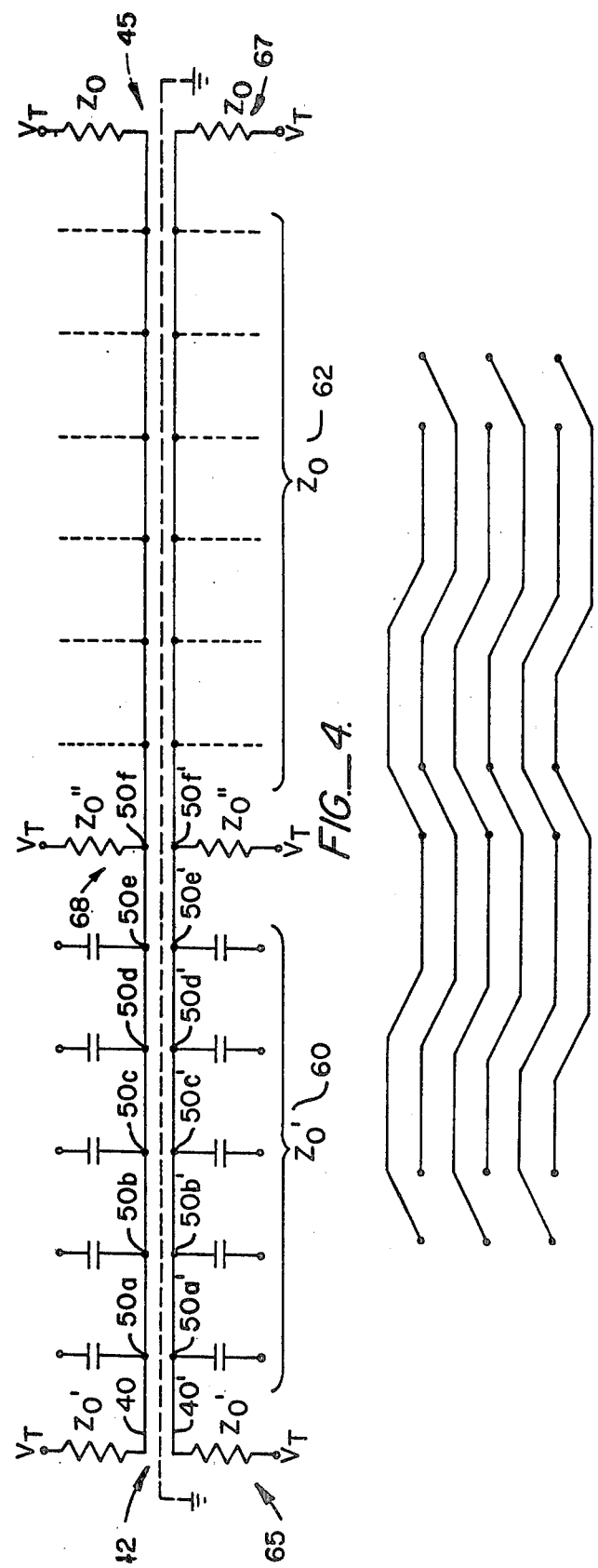
FIG._4.
FIG._5A.
FIG._5B.

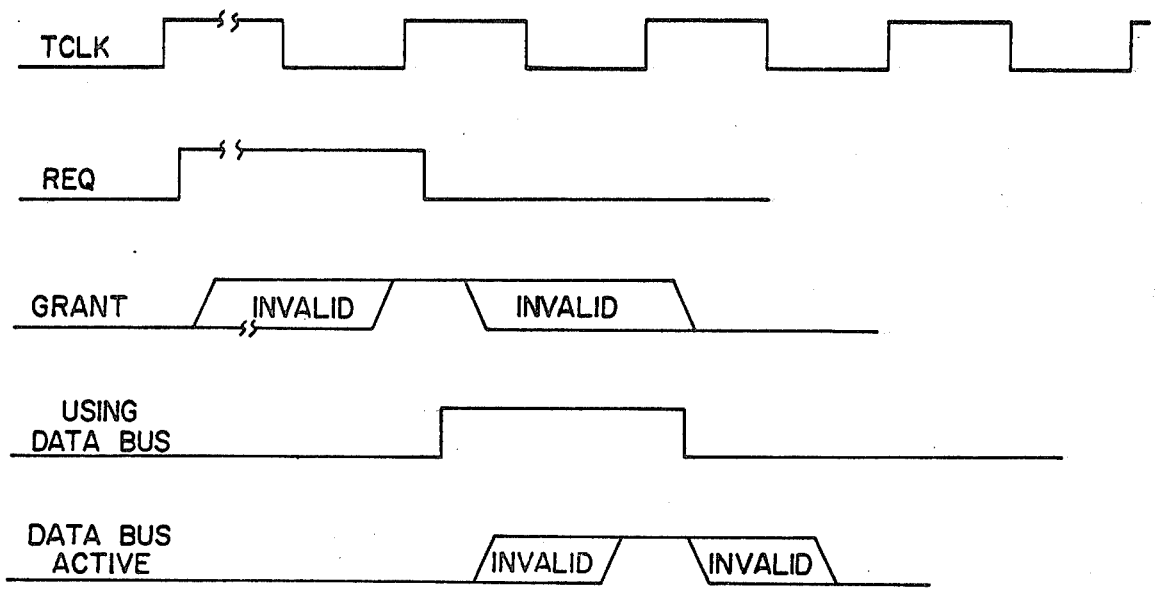
FIG._6A.
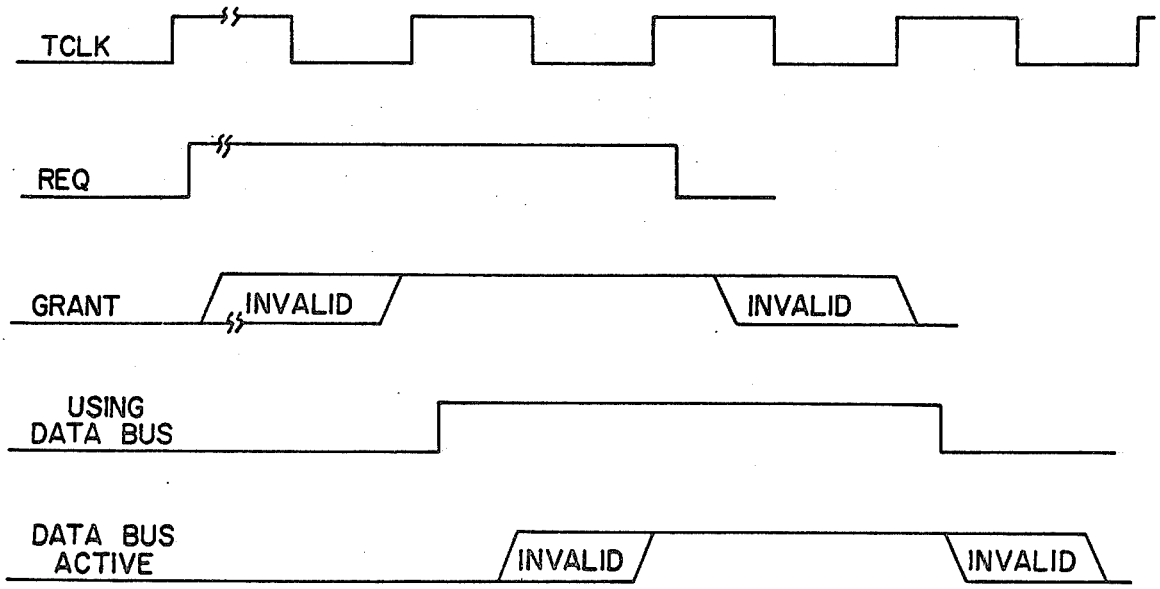
FIG._6B.

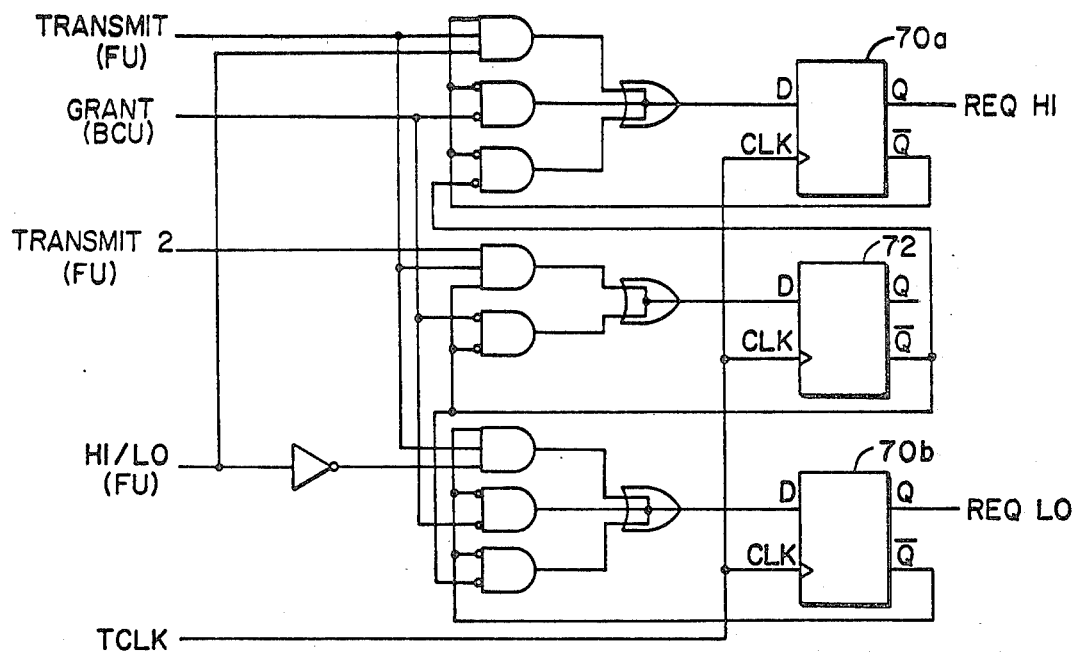
FIG._7.
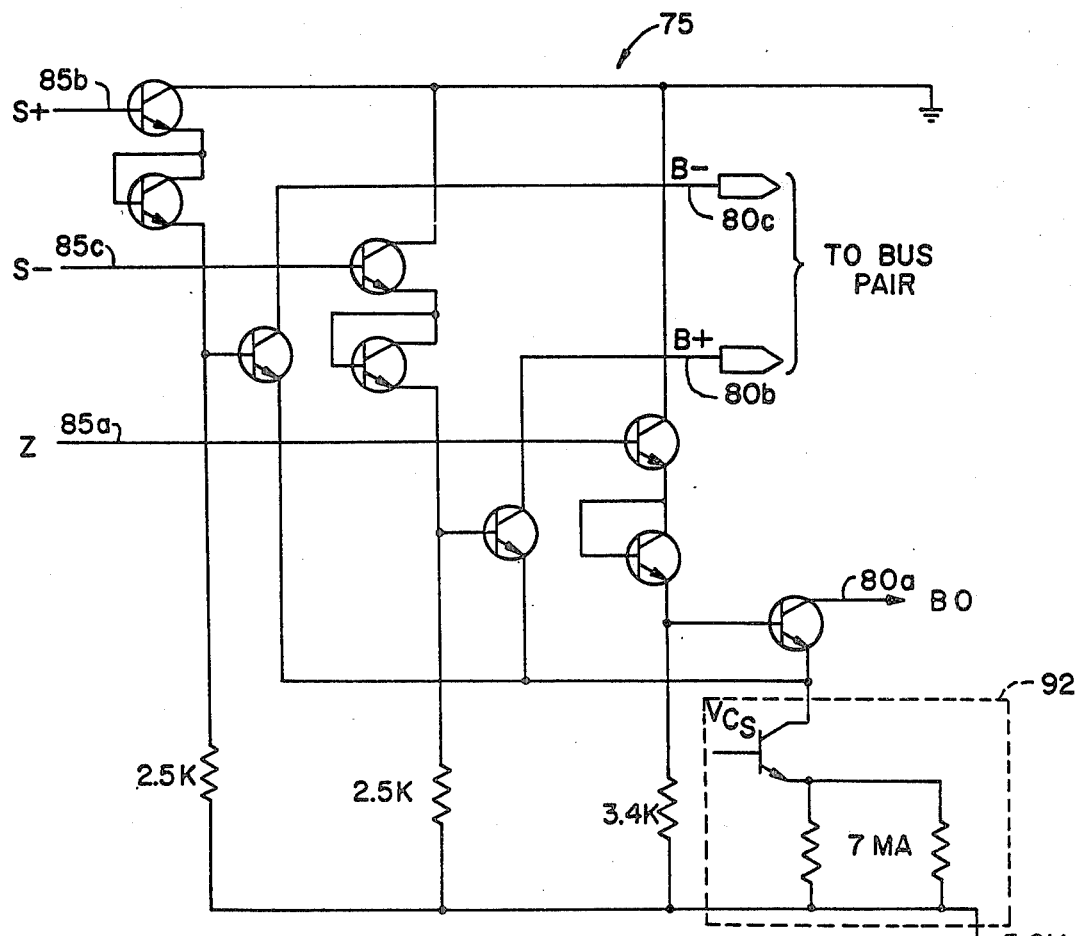
FIG._8.

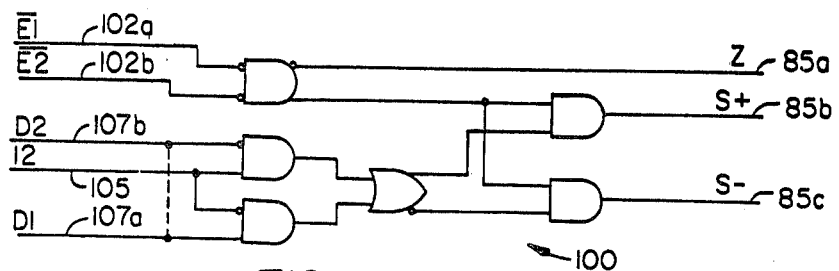
FIG._9A.
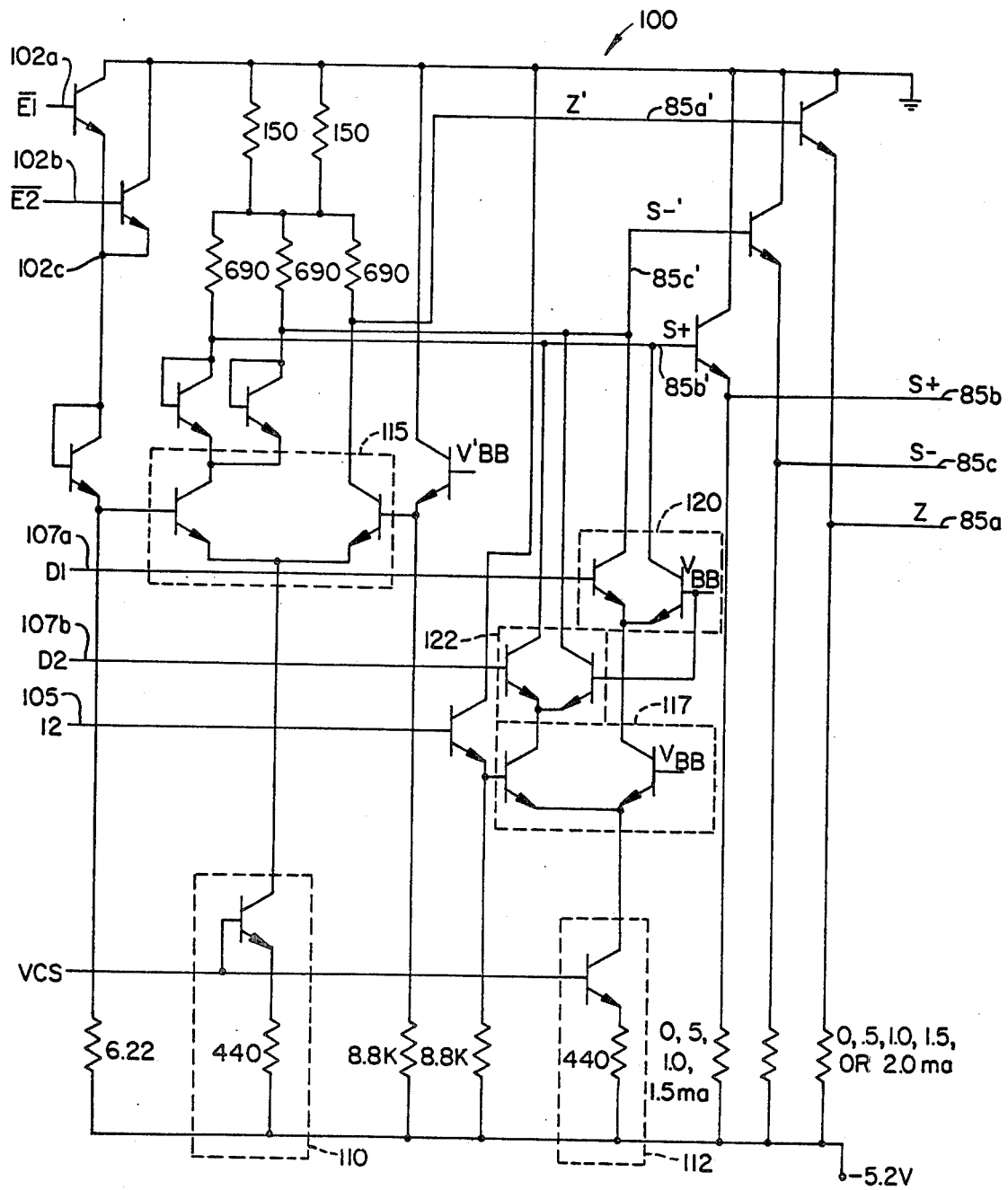
FIG._9B.

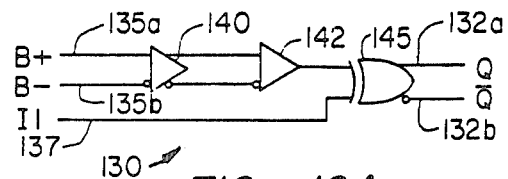
FIG._10A.
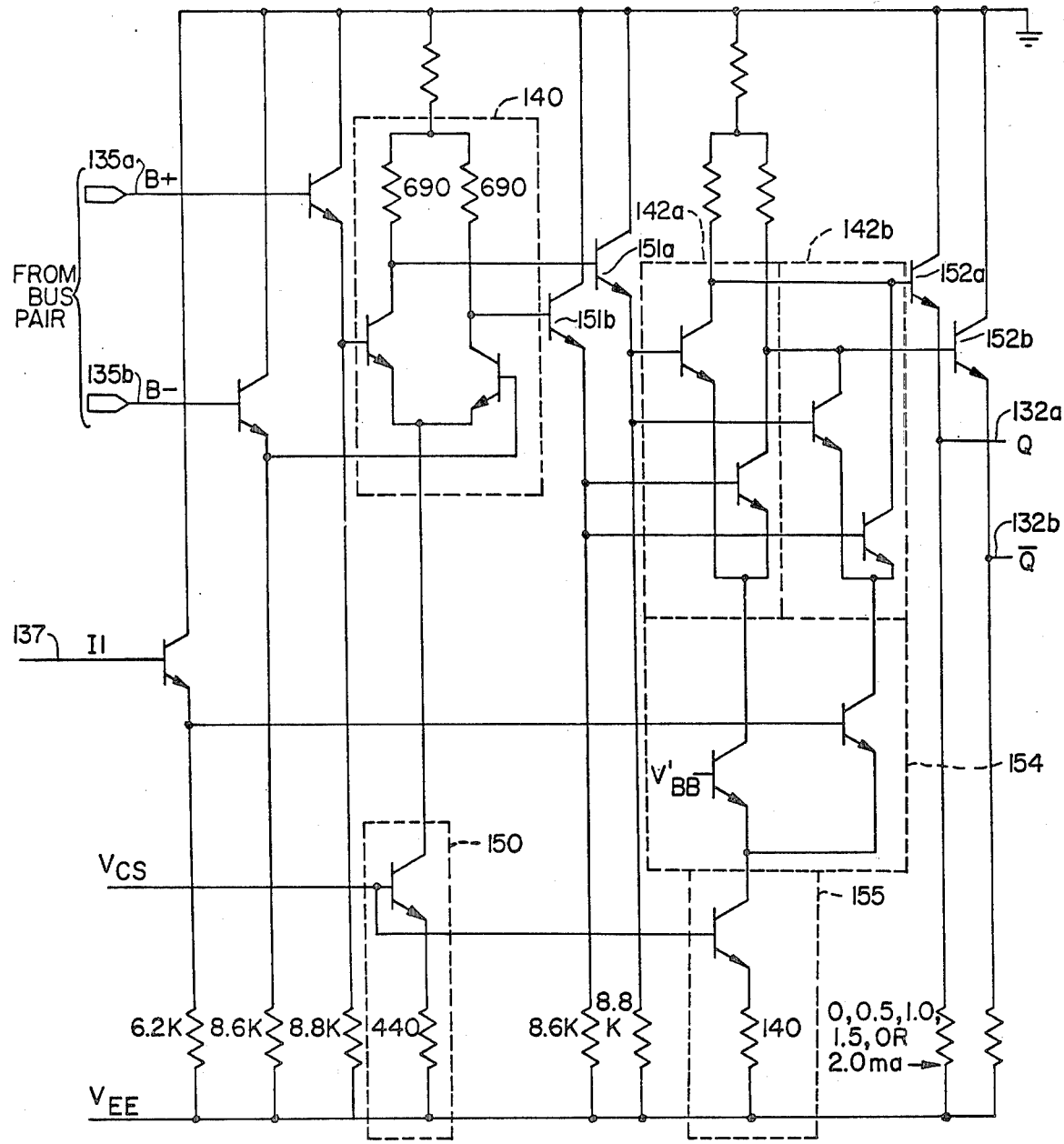
FIG._10B.

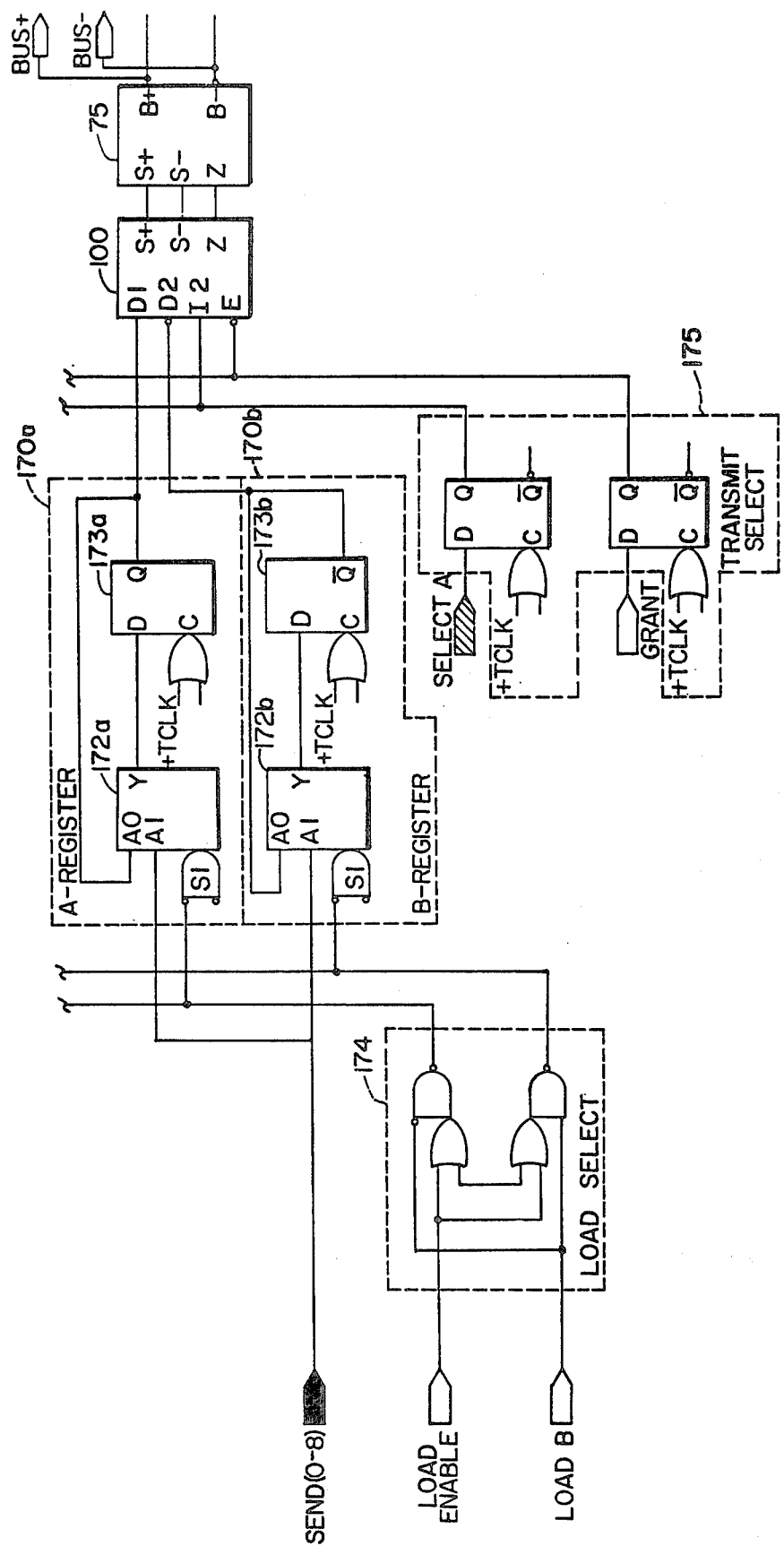
FIG._11A.

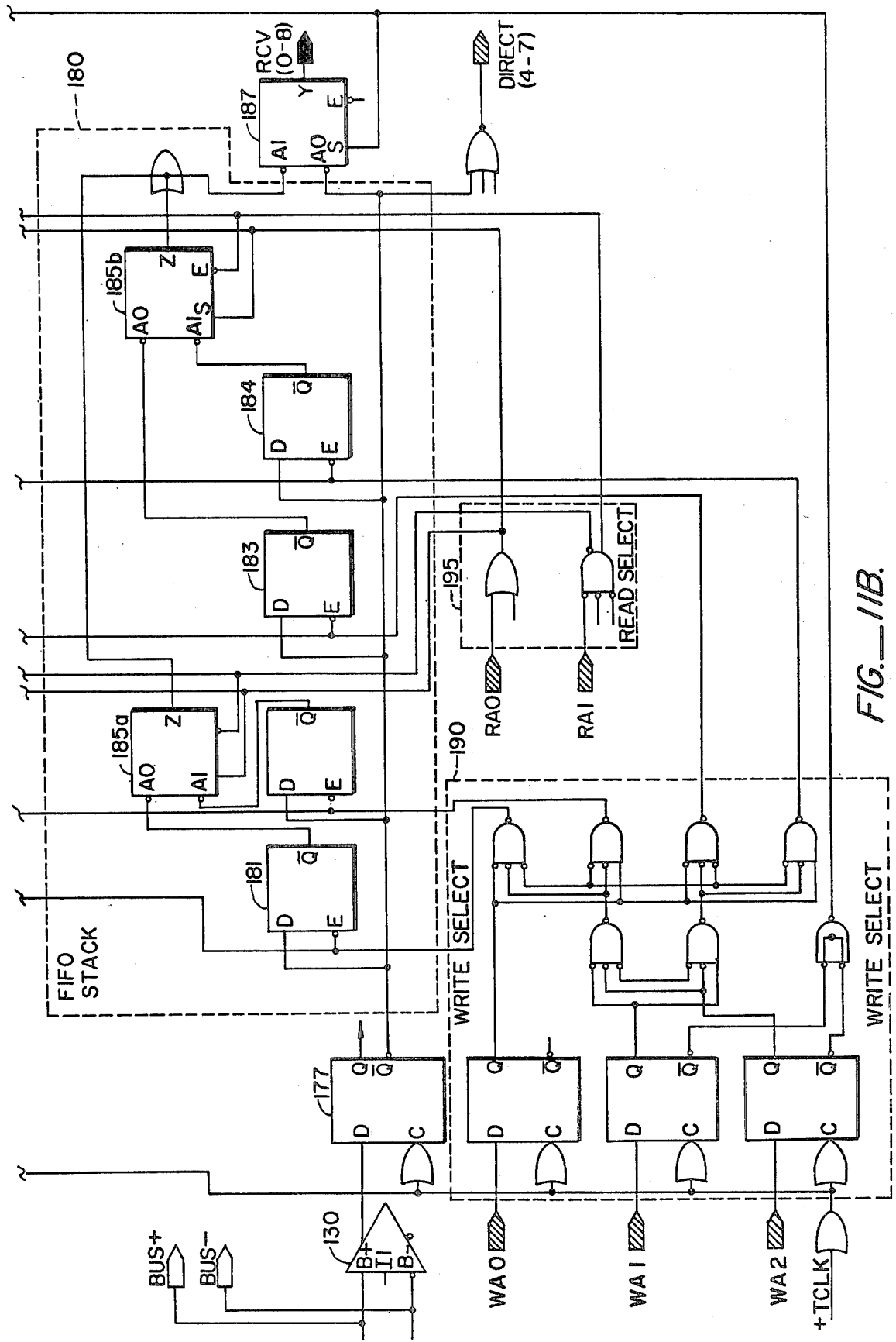
FIG.—11B.

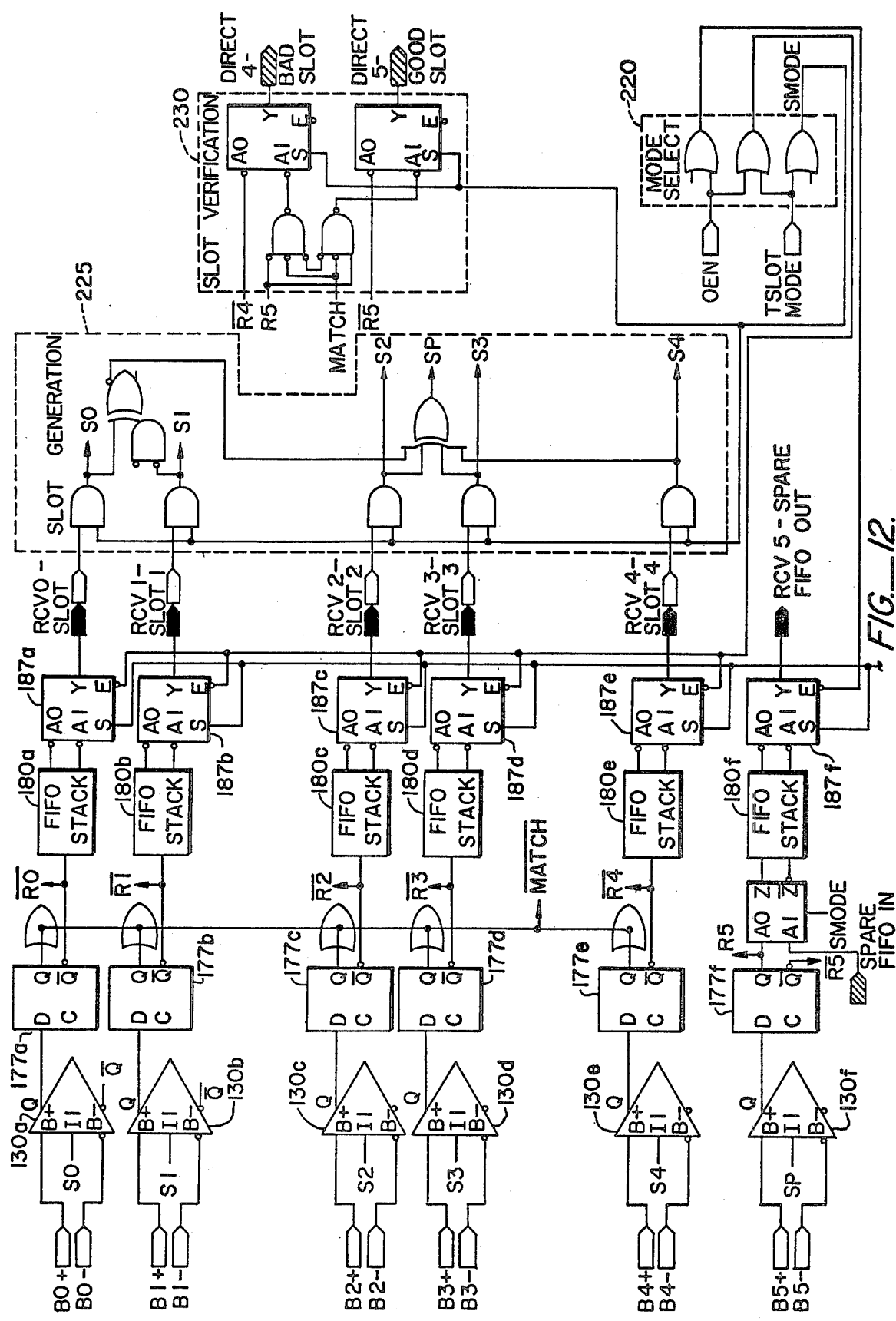
FIG._12.

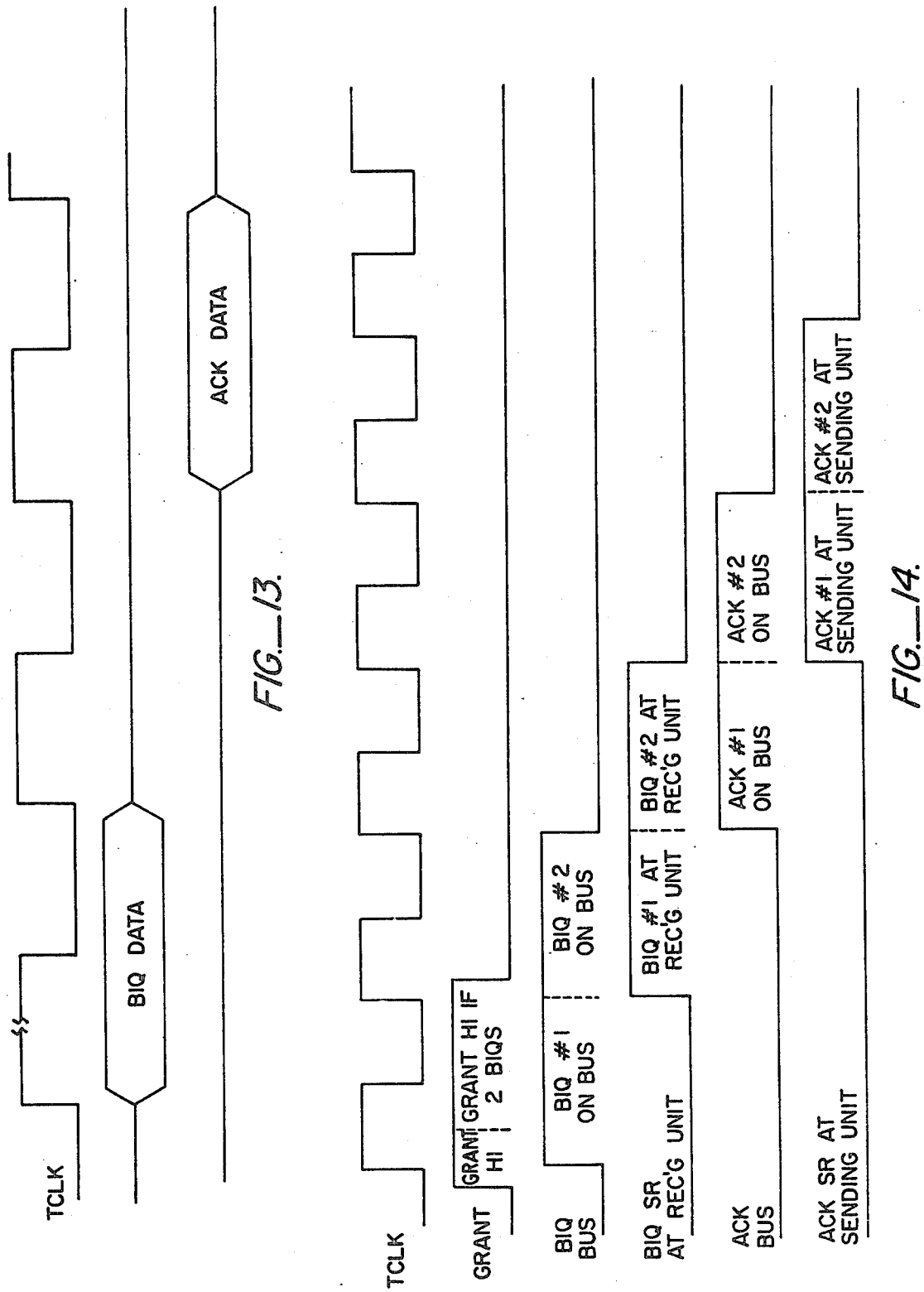
FIG._13.
FIG._14.

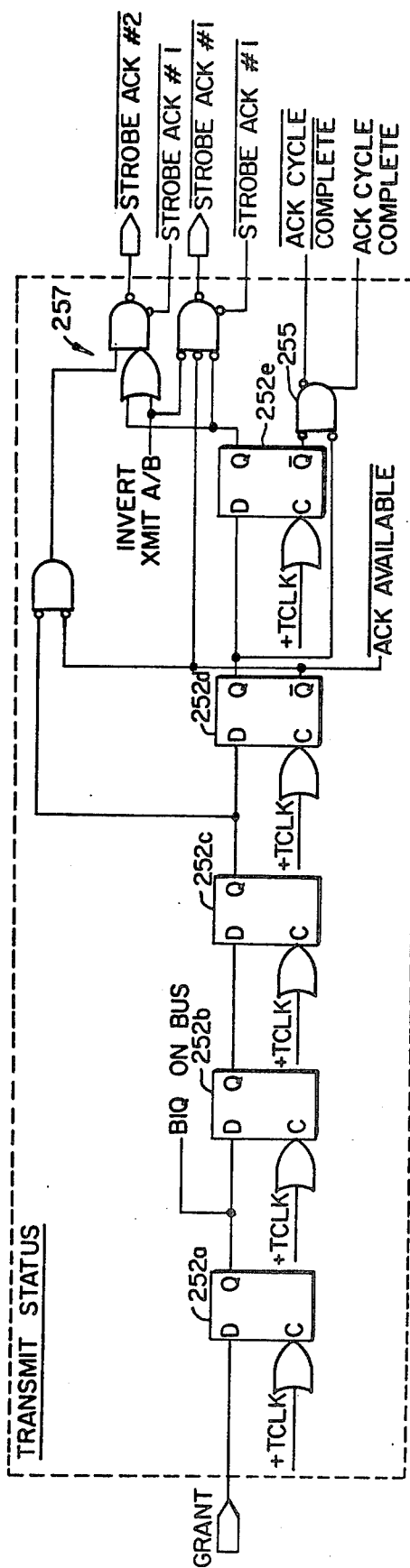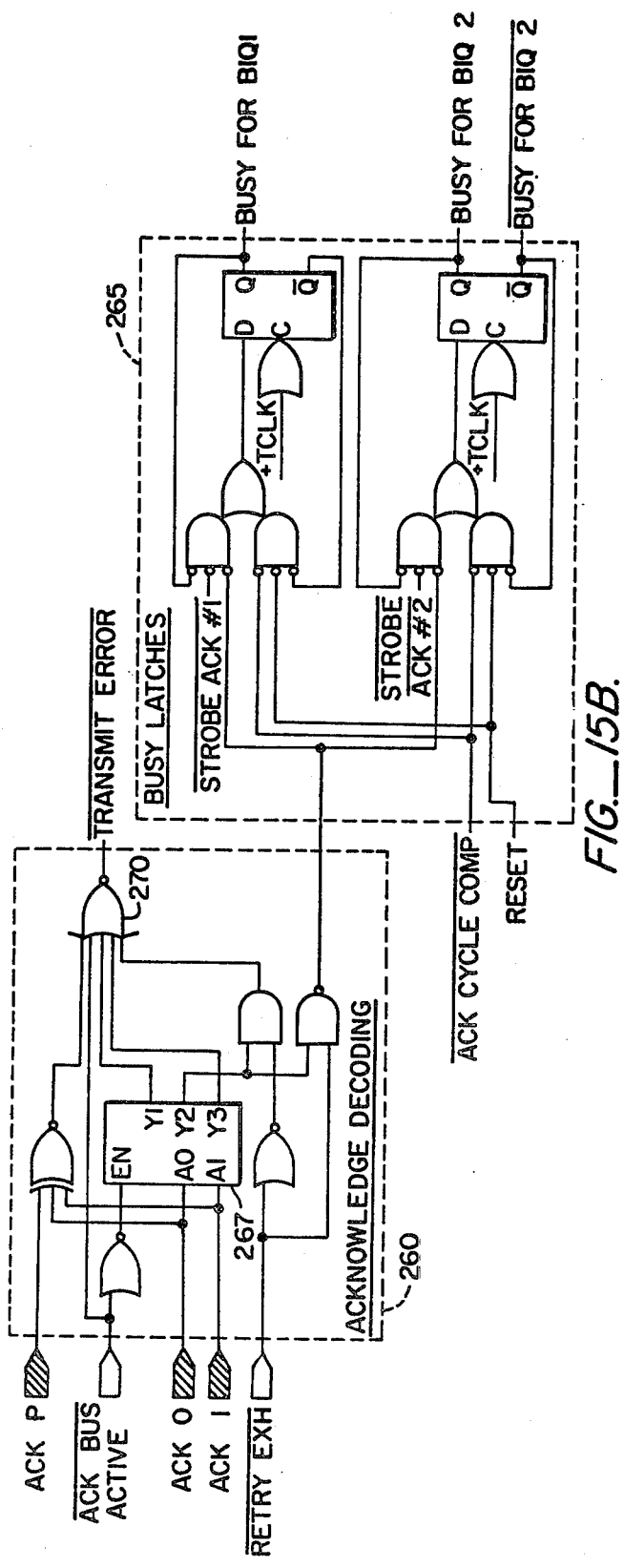
FIG._15A.
FIG._15B.

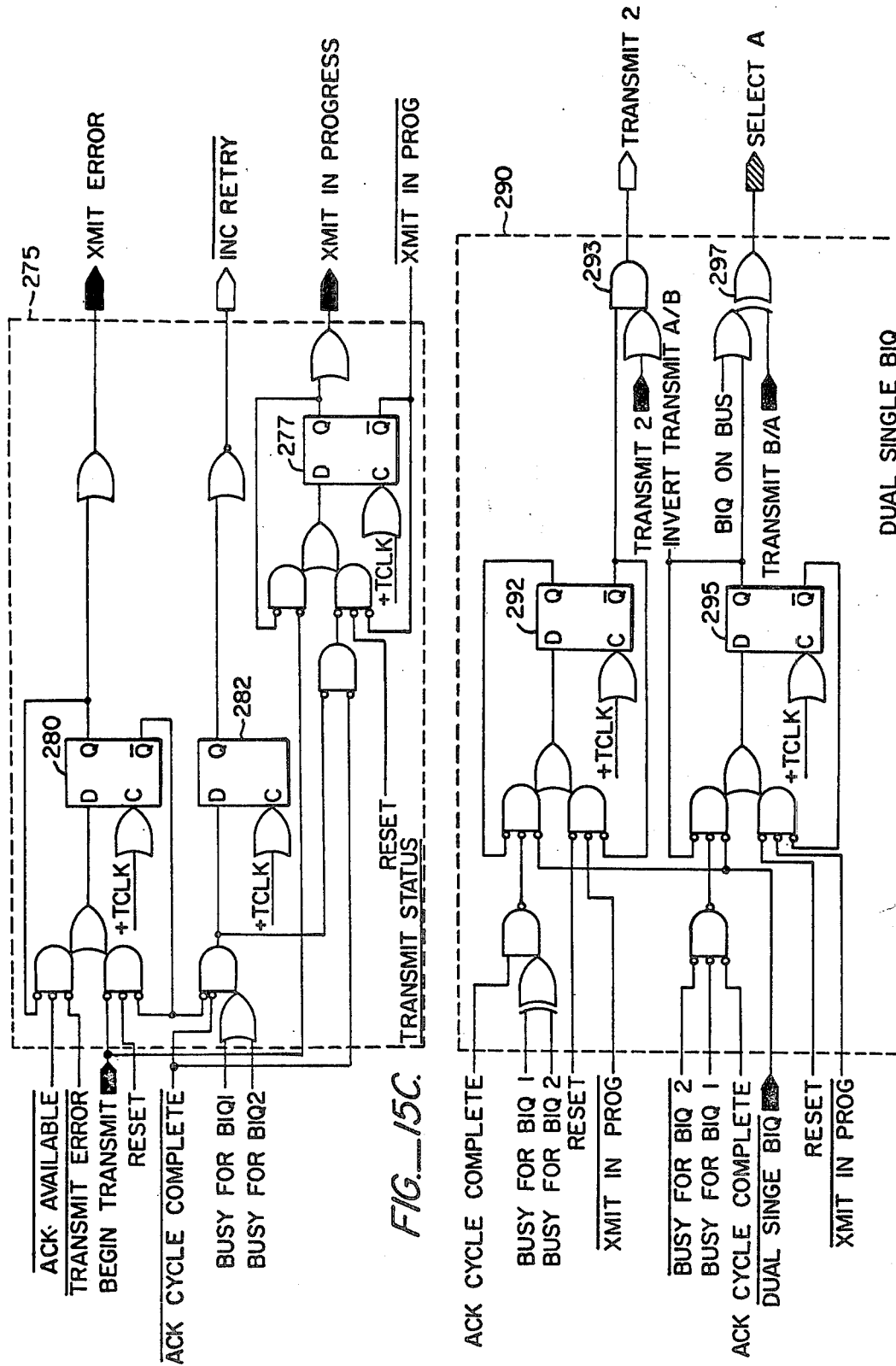
FIG.—15C.
FIG.—15D.

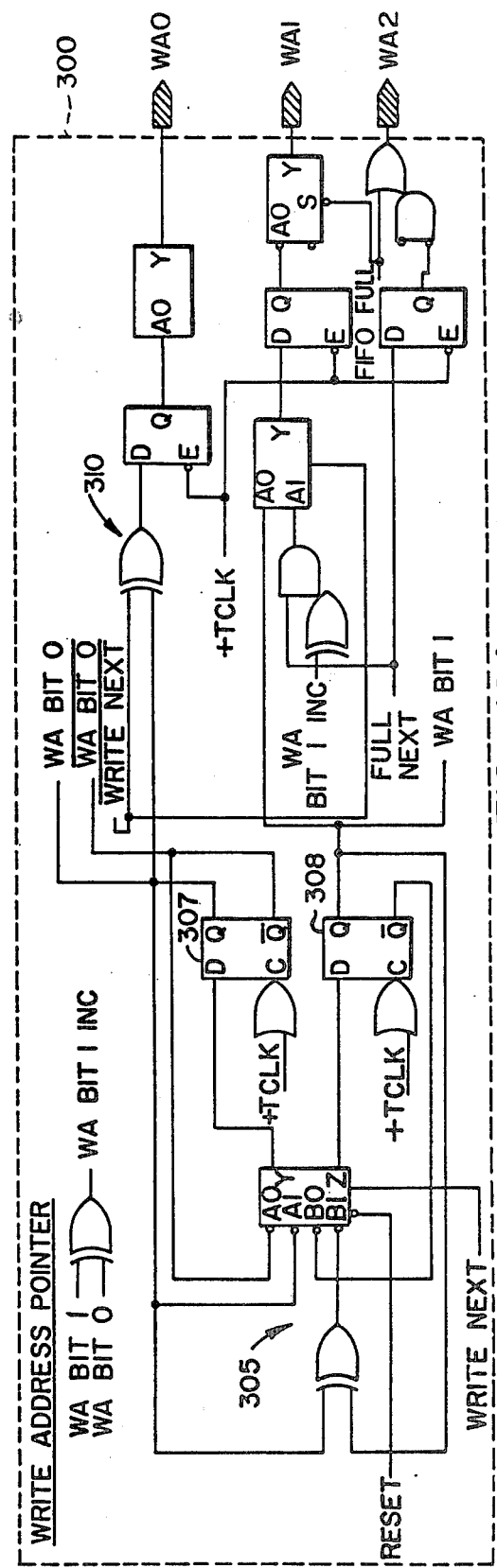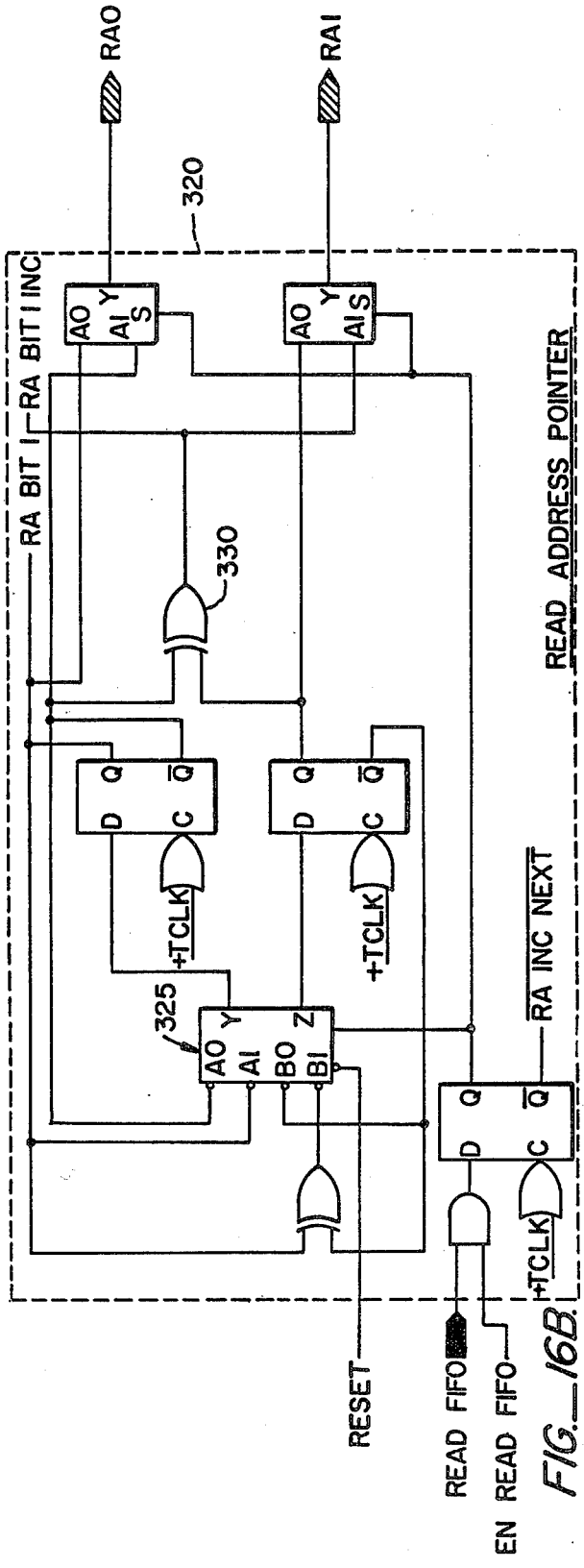

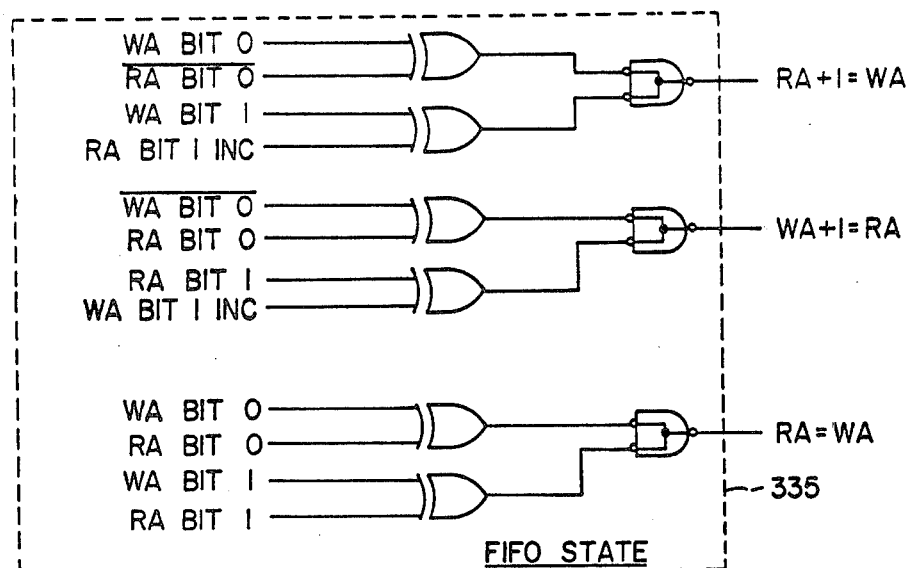
FIG._16C.
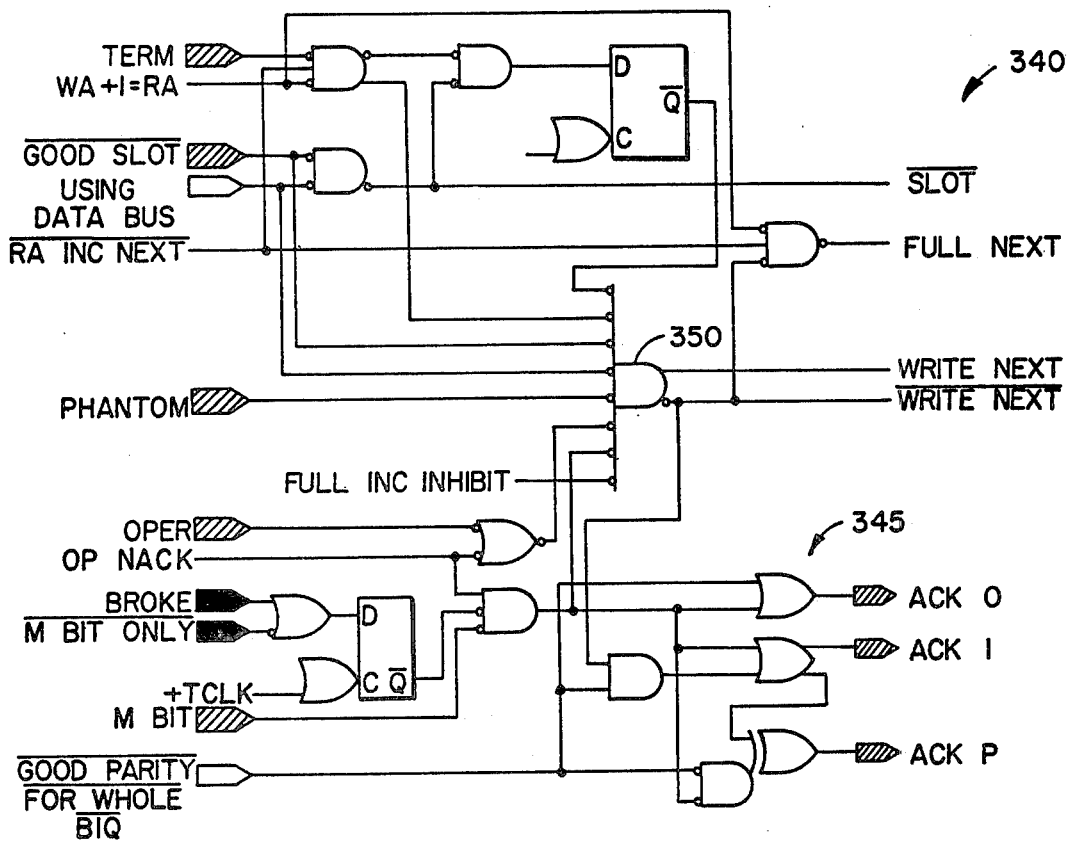
FIG._16D.

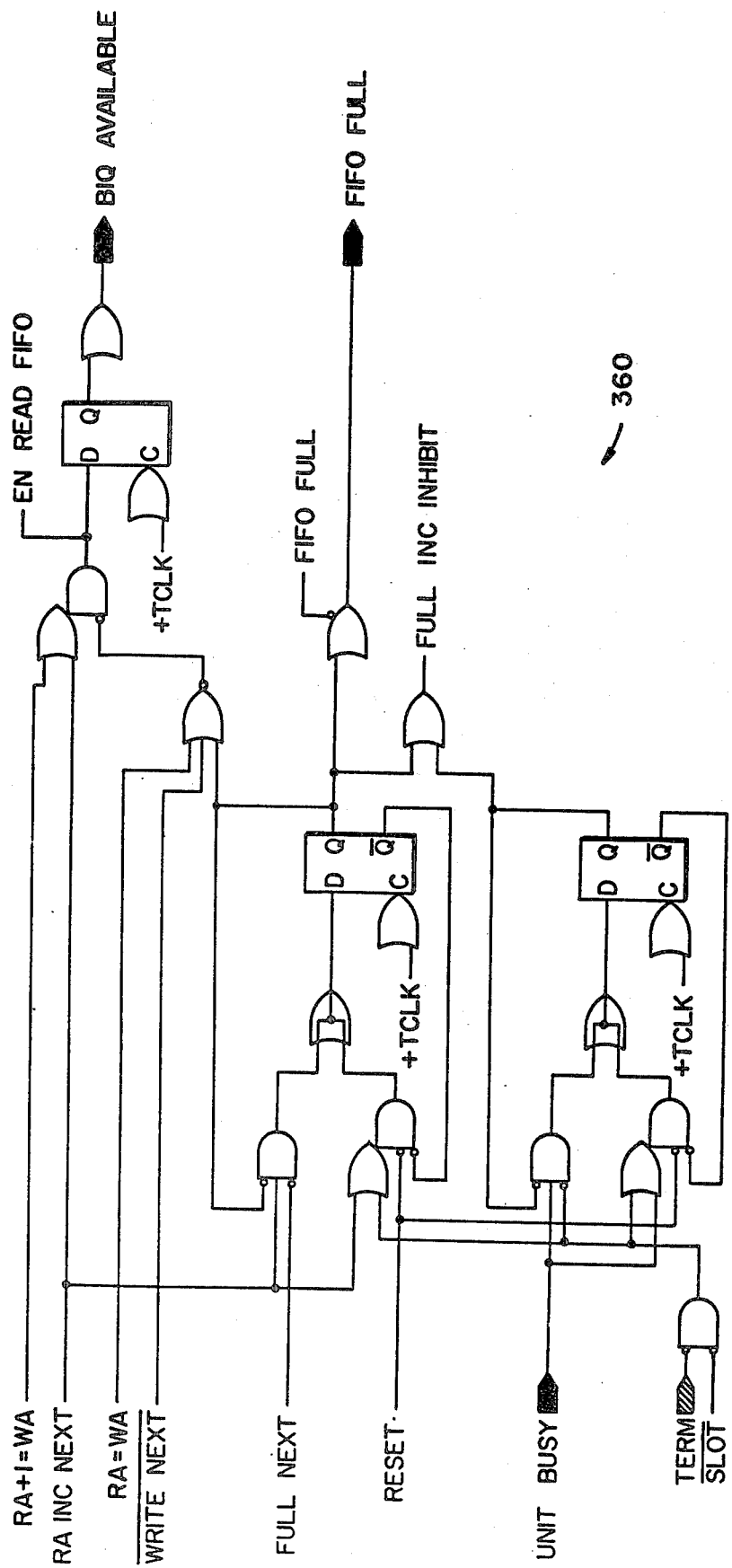
FIG.—16E.

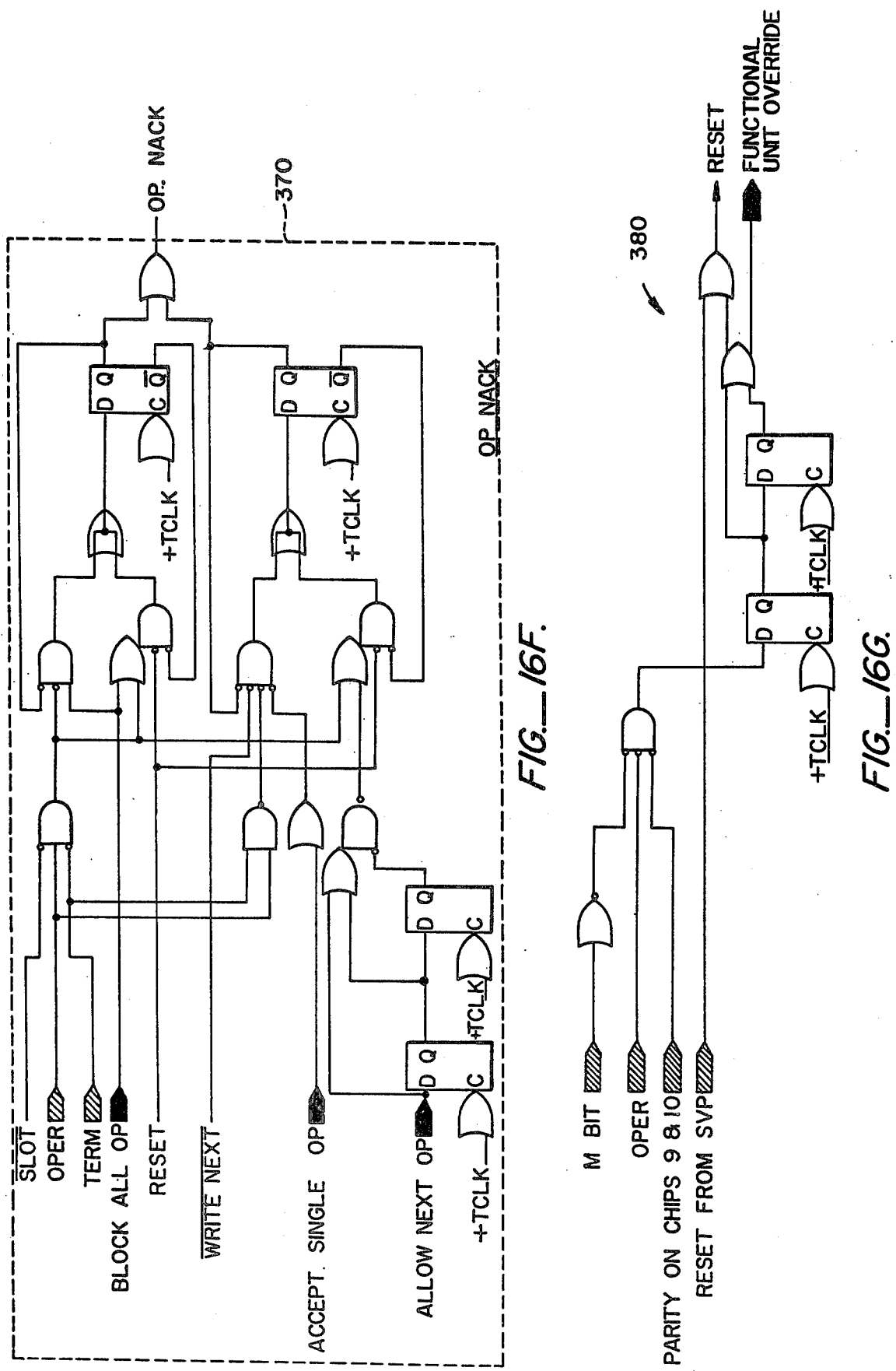

HIGH SPEED DATA BUS SYSTEM

FIELD OF THE INVENTION

The present invention relates to a high speed data communication bus system.

BACKGROUND OF THE INVENTION

A bus system provides a structure including communication paths over which a plurality of functional units may communicate signals among one another. It is typically contemplated that a common set of signal lines ("party lines") will be used, with the various functional units being connected in parallel to the party lines. The bus system may also include a number of "private" lines that provide communication paths between particular functional units. Although the term "bus" is sometimes used to refer to the signal lines themselves, or perhaps only the party lines, the term is often taken to include, in addition to the signal lines, the interface electronics ("ports") associated with the functional units for transmitting and receiving signals according to a specified bus protocol. The bus system also typically comprises centralized or distributed logical units for arbitrating requests from functional units for use of the bus.

The signal lines are sometimes implemented as generally parallel traces on a printed circuit board, known as a "backplane," with the circuit boards for the functional units plugging into connectors that hold the functional unit boards perpendicular to the plane of the backplane and perpendicular to the direction of the backplane circuit board traces. The signal lines define, along with a nearby power plane at a fixed DC level (for example, ground), respective transmission lines along which the bus signals propagate. A so-called "differential" bus dedicates a pair of lines to a given signal, with a voltage difference between the lines defining the signal polarity.

As attempts are made to increase the speed of data communication on the bus, the travel time of the signals along the backplane becomes an increasingly significant factor. For example, if a differential bus is used, differential delay between lines of a line pair results in distortion of the data. Moreover, care must be taken to avoid spurious signals arising from reflections that occur at impedance discontinuities. Such discontinuities are present, for example, where the signal driver for a given functional unit is characterized by a low output impedance when it is in its sending state. Thus, it is necessary to wait for the signal level change resulting from a first device's turning off its bus drivers to propagate past the bus drivers of a second device before allowing the second device to enable its bus drivers to transmit on the bus. Alternately, if the second device is allowed to enable its bus drivers so as to cause reflections, it is necessary to wait until such reflections propagate past the intended recipient of the second device's transmission before allowing the intended recipient to receive the transmission. In either event, bus "turnaround" requires extra "settling time" which slows down the system.

Accordingly, while the use of a backplane bus is attractive from a convenience and economy standpoint, the above limitations on speed have tended to make backplane buses unsuitable for large, high-speed computer systems.

SUMMARY OF THE INVENTION

The present invention provides a very high speed data bus system for communication among the various functional units that may constitute a large computer system. The bus communication medium comprises a number of line pairs on the backplane, and is implemented in a system that further comprises a bus control unit for arbitrating requests from functional units for use of the bus, and a plurality of interface units or ports, there being one such port associated with each functional unit. The bus lines may be electrically coupled to the functional units via an array of transversely extending circuit board connectors. The connectors are uniformly spaced at intervals along the bus lines from a first end to a second end thereof.

According to one aspect of the present invention, the functional units are densely packed, that is, mounted in immediately adjacent connectors. This defines a populated section of the backplane in which all connectors have ports coupled thereto, and one or two unpopulated sections of the backplane in which the connectors are empty. In order to ensure regular, close-spaced loading of the bus lines in the populated section, the ports are standardized so that each port presents a substantially identical loading along the transmission line. Due to the extra capacitive loading of the transmission line in the populated section, the characteristic impedance, designated $Z_0'$, is lower than the characteristic impedance, designated $Z_0$, in the unpopulated region. A populated end of the transmission line is resistively terminated with a resistance corresponding to $Z_0'$ while the unpopulated end is terminated with a resistance corresponding to $Z_0$. The border between the populated and unpopulated sections is terminated with a resistance corresponding to $1/(1/Z_0' - 1/Z_0)$, designated $Z_0''$, thus eliminating signal reflections that could compromise data integrity and degrade system performance.

Each port includes an appropriate number of receivers and drivers for the transmission line pairs. Party line bus signals on a given line pair are driven by a three-state differential current-mode bus driver that selectively sinks a predetermined current on either or neither line of the transmission line pair, and received by differential receivers. An advantage of the current mode drivers is that, unlike voltage-mode drivers, they have a very high output impedance so that a signal propagating on the bus encounters no significant discontinuity in line impedance when it passes a current-mode driver that is enabled. Thus reflections are avoided and high speed bus "turnaround" is possible. Moreover, current mode transmission does not require the very high output current normally required by voltage mode buses when driving lines with low effective characteristic impedances.

According to a further aspect of the invention, the two lines that define each differential line pair may be effectively crossed over between successive connectors on the backplane so that an individual line is connected alternately to the positive and negative receiver input terminals at successive ports. This pseudo-twisted-pair configuration has the advantage of evening out any systematic imbalances between lines of a given line pair. For example, imbalances in capacitive loading can result in the lines of a pair having different effective impedances and propagation velocities, thus converting common mode noise to normal mode noise. The advantage of the pseudo-twisted-pair configuration is achieved at the expense of somewhat more complicated logic in the drivers and receivers, since the polarity of signals transmitted and received by a given port depends on that port's position on the bus.

The conditional inversion is accomplished by exclusive-OR gates incorporated into the drivers and receivers, which receive a polarity signal representative of the port position on the line. The polarity signal may be conveniently provided by a trace on the backplane that is held at a particular DC level and is communicated only to alternate connectors.

According to a further aspect of the invention, driver gating circuitry responsive to first and second data input signals, an enable signal, and a conditional inversion input signal performs multiple levels of gating with a minimum of propagation delay. The driver gating circuitry comprises first and second differential pairs for receiving the respective data input signals. The paired outputs of each of the differential pairs are coupled to a pair of S+ and S− output lines, but with opposite polarities for the two differential pairs. A first current source is steered by a first current steering network controlled by the conditional inversion input signal, and selectively activates one or the other of the differential pairs so that one of the S+ and S− outputs is pulled to an inactive level. A second current source is steered by a second current steering network controlled by the enable input signal. When the enable signal is present, a Z output line is pulled to an inactive level; when absent the more active of the S+ and S− lines is pulled to an inactive level. In an embodiment wherein the pseudo-twisted line pair configuration is not used, the gating circuitry functions as a 2:1 multiplexer to selectively couple either of two signal sources onto the bus, with the conditional inversion input functioning as the data select line.

According to a further aspect of the present invention, the preferred differential receiver amplifies a relatively low level differential input signal and performs an exclusive OR function with a conditional inversion signal with a minimum propagation delay between the signal input and an output line pair. The input signal is fed to a differential preamplifier stage, the output of which is communicated to first and second differential amplification stages. The first and second differential amplification stages are coupled to the output line pair with opposite polarities. Selective activation means comprising a current source and a current steering network responsive to the conditional inversion signal selectively activates one and only one of the first and second differential amplification stages to thus control the polarity of the output signal. In an embodiment where the pseudo-twisted line pair configuration is not used, the built in exclusive OR capability of the receivers may be used to provide very fast comparison of the signals on the port address lines of the bus with the address of the receiving port. The outputs from the receivers on the port address lines are communicated through an OR gate to provide a signal indicative of whether a match was detected or not.

The control logic for each port includes screening circuitry responsive to the state of the port's input buffers, and further responsive to flags from the functional unit for selectively accepting or rejecting BIQ's (a "BIQ" is a bus information quantum which is placed on the bus for one bus cycle). Depending on the flag, the rejection may be total, or may apply only to a designated class of transfers (for example, so-called operations). According to a further aspect of the present invention, the screening circuitry is constrained to accept all related information that makes up a communication, or if this cannot be done, to accept none of the information. More particularly, an information transfer, depending on its nature, may comprise one BIQ or more than one BIQ. To implement the indivisibility of multiple-BIQ transfers, the control circuitry includes screening constraint circuitry to ensure that the port accepts all or none of the BIQ's that make up the transfer. Each BIQ includes control bits representative of the length of the transfer and the position of the BIQ in the transfer. The circuitry senses these bits and for a non-final BIQ, only allows the acceptance of a BIQ if there is sufficient space in the input buffers to accept all the remaining BIQs in the transfer. In an analogous manner, the constraint circuitry also determines whether the screening circuitry rejected an earlier BIQ in the transfer, and if so, it prevents the acceptance of all remaining BIQs in the transfer, even if sufficient space in the input buffers has become available. Similarly the constraint circuitry operates to prevent the port from honoring the assertion or removal of one of the flags if the assertion or removal occurs after the acceptance or rejection of a non-final BIQ but prior to the acceptance or rejection of a final BIQ in a transfer.

According to a further aspect of the present invention, each sending and receiving port is provided with registers corresponding to information fields that permit a unique identification and characterization of a given BIQ without requiring that earlier bus states be remembered. For example, each BIQ (whether an operation or a response) includes fields corresponding to both the originating and the destination functional units, as well as a separate, internally defined tag field. The tag field is assigned and transmitted by the functional unit originating an operation, and is echoed by the functional unit originating a response. This identification scheme makes it possible to easily achieve full bus utilization since there is no need for the bus to remain inactive while operations are being acted upon.

For a further understanding of the nature and advantages of the present invention, reference should be made to the remaining portions of the specification and to the attached drawings.

BRIEF DESCRIPTION OF THE DRAWINGS

FIG. 1 is an overall block diagram of a data communication system utilizing the bus system according to the present invention;

FIG. 2 is a block diagram of a typical computer system utilizing the bus system;

FIG. 3A is a block diagram showing the communication between a given port and the central bus control unit;

FIG. 3B is a block diagram of the port showing the pin symbol shading;

FIG. 4 is a schematic showing the bus transmission line characteristics;

FIGS. 5A-B are plan views of transmission line traces;

FIGS. 6A-B are timing diagrams of the bus request and grant signals;

FIG. 7 is a logical schematic of circuitry for handling the request and grant signals;

FIG. 8 is a circuit schematic of the current drivers within a SBT slice;

FIGS. 9A and 9B are logical and circuit schematics of the driver gating;

FIGS. 10A and 10B are logical and circuit schematics of the receiver gating;

FIG. 11A is a logical schematic of the circuitry within a SBT slice for communicating one bit of data from the functional unit onto the bus;

FIG. 11B is a logical schematic of the circuitry within a SBT slice for communicating one bit of data from the bus to the functional unit;

FIG. 12 is a logical schematic of circuitry within a SBT slice for correlating the slot address;

FIG. 13 is a timing diagram of the BIQ and ACK signals;

FIG. 14 is a timing diagram illustrating the BIQ and ACK bus activities and register states;

FIGS. 15A-D are logical schematics of the system bus control transmit circuitry; and FIGS. 16A-G are logical schematics of the system bus control receive circuitry.

DETAILED DESCRIPTION OF THE INVENTION

Overview

FIG. 1 is a block diagram illustrating a bus system that permits a plurality of functional units 10 to communicate with one another. A set of data communication lines 20 provide signal paths among functional units 10, and between functional units 10 and a bus control unit (BCU) 22.

FIG. 2 is a block diagram showing a particular computer system implementation comprising functional units 10a, 10b, 10c, and 10d. Functional unit 10a is a data processing unit (called a CPU, even though there may be more than one) including a cache/TLB (translation lookaside buffer) 11a and an arithmetic logical unit (ALU) 12a, and further communicates with a floating point accelerator (FPA) 13a. Functional unit 10b is a service processor (SVP) which can be used for initialization and reconfiguration of the computer system. Functional unit 10c is a memory controller (MC) which communicates with memory units 11c and 12c. Functional unit 10d, in a particular implementation, is an I/O channel processor (IOCP) comprising a cache/TLB 11d, an ALU 12d, and a channel interface 13d. Channel interface 13d communicates via a separate bus 14d with a tape controller 15d, an asynchronous multiplexer (MUX) 16d, and a disk controller 17d.

FIG. 3A is a block diagram showing the manner in which a given functional unit 10i communicates with BCU 22 and other functional units over communication lines 20. As seen above, the various functional units within the system may be very different from one another. However, each functional unit has associated with it a port 25 that interfaces to lines 20. All the ports in the system are essentially identical.

In the remaining portions of the specification, the term "functional unit" will sometimes be used to refer to the portions of the functional unit exclusive of the port. Where the distinction is important, a term such as "the functional unit proper" will be used to describe the portion of the functional unit without the port. Where appropriate, the functional unit proper will be assigned a reference numeral 26.

Communication lines 20 include a set of common or party lines 30, signals appearing on which are communicated to all functional units. In the discussion that follows, party lines 30 will often be referred to as the "bus." BCU 22 is a logical unit that arbitrates requests from the functional units for the use of the bus, and issues permission for such use on a priority basis. The connection between BCU 22 and party lines 30 is shown to include bus control signals which are provided by BCU 22 to the functional units. These two signals indicate bus status. BCU 22 communicates with each functional unit on a set of radial or "private" lines. For example, BCU 22 communicates with functional unit 10i on a set of private lines 32i, and with another functional unit 10j (not shown) on another set of private lines 32j.

Signals are transmitted on the bus by three methods: differential voltage mode, differential current mode, and single ended. Differential voltage mode signals are driven by standard ECL drivers that provide both a true and complement voltage signal; the true signal is applied to one side of a pair of wires, the complement to the other. An example of a signal of this type is the system clock signal SYSCLK. Differential current mode signals are activated by driving a current on one of a pair of wires, a current on one of the pair constituting a logic "1", a current on the other as "0". The state of the pair is defined when one, and only one, wire is being driven. Party lines 30 are examples of this method of signal transmission. Single ended signals are transmitted on a single wire, the state of the signal being determined by its voltage relative to a fixed reference, commonly ground. The bus request signals are examples of this transmission method. Differential signals provide substantial immunity to noise, including both AC sources and DC sources generated, for instance, by static ground drops and level shifts caused by temperature differentials.

Although a detailed description of the timing and significance of the various signals appearing on party lines 30 and private lines 32i will be deferred until the basic hardware description is completed, a brief summary will be given at this point. The bus information quantum (BIQ) which is communicated between functional units on party lines 30 comprises 110 bits of information (addresses, commands, data, spares). Upon receipt of a BIQ, the port logic in a functional unit transmits two acknowledgment signals (ACK 0 and ACK 1) and an ACK parity signal (ACK P) on designated ones of party lines 30. The subset of party lines 30 that carry the ACK signals is sometimes referred to as the ACK bus. SVP 10b communicates three system control signals representative of overall system status on party lines 30. The signals on private lines 32i include a system clock signal (SYSCLK) and bus control signals. The bus control signals consist of two bus request signals (REQ HI and REQ LO) sent by functional unit 10i and a bus grant signal (GRANT) sent by BCU 22.

Port 25 includes eleven integrated circuit chips 35, hereinafter called "SBT (system bus transceiver) slices," and SBC (system bus control) circuitry 37 that interfaces the SBT slices to the rest of the functional unit. Each SBT slice contains I/O buffer registers, parity logic, address recognition logic, and ten bus transceivers (each having a differential receiver and a current mode driver, to be described below), and communicates with a particular subset of ten line pairs of party lines 30. The BIQ and ACK signals collectively represent 110 bits of information, and are generally communicated to the eleven port slices in groups of eight bits of information plus one parity bit, the tenth is used incidentally for system control functions or acknowledges. SBC circuitry 37 includes appropriate drivers and receivers for sending the bus request signals and receiving the bus grant and clock signals on private lines 32i.

SBT slices 35 and the major part of SBC circuitry 37 are each implemented as a single integrated circuit chip of the type sold under the Motorola Semiconductor Products, Inc. trademark "MECL 10,000 Macrocell Array." A "Macrocell" chip is a cellular logic array that allows a semi-custom chip design to be developed by providing a large number of transistors and resistors organized in discrete regions of the chip (cells). The transistors and resistors may be interconnected according to a library of cell designs to provide latches, flip-flops, gates and the like. In the chip type used herein, the cell complement consists of 48 so-called "major" cells, each including approximately 100 discrete components (resistors and transistors), 32 so-called "interface" cells, each including approximately 31 discrete components, and 26 so-called "output" cells, each including approximately 29 discrete components. The components included in major and interface cells are designed for relatively low-power circuits which produce internal signals that are confined to the chip itself, while the output cell components are designed primarily for the higher power requirements of driving signals out of the chip. The receivers and drivers within port slices 35 were specially designed for this particular application.

The "Macrocell" chip within port control circuitry 37 is assigned a reference numeral 39, and will be hereinafter referred to as the system bus control chip or the SBC chip. FIG. 3B is a block diagram illustrating schematically the interconnections between functional unit proper 26, SBC chip 39, SBT slice 35, and bus 30. In the various logical and circuit schematics to be described in the remaining portions of the specification, connections to a pin of either SBC chip 39 or one of SBT slices 35 will be shown as pentagonal pin symbols. In order to render the schematics more self-consistent and informative, the pin symbols will be shaded depending on the origin or destination of the signal appearing at that pin. Specifically, a SBC chip or SBT slice pin will be shown as solid if it communicates with the functional unit proper. A SBC chip pin will be shown as diagonally hatched if it communicates with a SBT slice, as will a SBT slice pin if it communicates with the SBC chip. A SBC chip or port slice pin will be unshaded if it communicates with the bus, the BCU, portions of the SBC circuitry not on SBC chip 39, or the system clock. Appropriately shaded pin symbols are shown in FIG. 3B.

Transmission Line Configuration

The physical embodiment of communication lines 20 is a circuit board traces on one or more signal layers of the system backplane. The backplane preferably comprises, in addition to the signal layers, a plurality of layers, known as power planes, that are held at the various DC levels necessary for system operation. The backplane is of standard laminated circuit board construction with alternating conductive layers and dielectric layers, with the signal layers being the outermost ones. The traces for party lines 30 are generally parallel and extend generally from a first edge to a second opposite edge of the backplane. Connections to the circuitry of port 25 are made through connectors such as AMP Incorporated Box Connectors extending perpendicularly across the lines at intervals of approximately 0.9 inches between adjacent connectors. The functional unit circuit boards (referred to as "daughter boards") are plugged in to adjacent connectors, extending in parallel planes perpendicular to the transmission lines and to the backplane. A given position along the bus, as defined by the existence of a connector, will sometimes be referred to as a "slot." The physical slot address (that is, a binary number representative of the relative slot position) is hardwired as follows. For a 5-bit slot address, each connector has six dedicated pins. The first pin is held at a logical 1 level, and communicates via short conductive traces on the backplane with selected ones of the remaining five pins. This alleviates the need for busing signals between connectors. In an alternate embodiment, the SVP also assigns each functional unit in the system a unique identification label, called a Virtual Slot Address, which need not be correlated with the functional unit's physical position relative to other functional units. BCU 22 attaches to the backplane via additional connectors which pass private lines, excluding clocks, between BCU 22 and the backplane.

The line for a given signal (e.g. a bit of a BIQ) defines, along with the neighboring power plane, a transmission line having a characteristic impedance determined primarily by the spacing between the signal layer and the power plane, and the dielectric characteristics of the backplane circuit board. The neighboring signal lines (traces) also have an effect on the transmission line characteristics, although a relatively small one since the power plane is closer than the neighboring signal lines. An impedance of 95–100 ohms and a capacitance of about 18–20 pf/foot is typical. For a given line pair, each connector adds approximately 4 pf while the port adds approximately 8.5 pf (2.5 pf for daughter-board traces and 6 pf for port electronics).

When a transmission line is loaded with equal lumped capacitances at regular intervals, the effect of such capacitive loading for signals having rise and fall times that are long relative to the transit time of the signal between capacitive loads is such that the load capacitances behave as if they were evenly distributed along the transmission line. THe result is that the effectively propagation delay of the line is increased by a factor of $\sqrt{1+C_1/C_0}$ where $C_1$ and $C_0$ are the load and transmission line capacitances per unit length, respectively. The effective characteristic impedance of the line is reduced by the same factor. In the present system, the transmit time between connectors is approximately 128 ps which is short relative to the rise and fall times of signals on the line (generally $\geq 600$ ps). Therefore, the approximation of the lumped capacitances acting as if uniforming distributed is valid.

FIG. 4 is a schematic representation a line pair having first and second lines 40 and 40' extending from a first end 42 to a second end 45 of the system backplane. Lines 40 and 40' are resistively terminated at a DC voltage, designated $V_T$, the choice of which will be discussed below in connection with the bus driver circuitry. The connectors are coupled to lines 40 and 40' at successive connection points 50a and 50a' for a first connector, 50b and 50b' for a second connector, and so on. In all, twelve such connection point pairs are shown. The first five connection slots are shown as being capacitively loaded, signifying the presence of a functional unit port. The five functional units filling the first five connectors define a populated section 60 of the transmission line while the empty slots starting from second end 45 define an unpopulated or empty section 62. Thus, unpopulated section 62 has an effective characteristic impedance (including the effect of the capacitance of the connectors) of approximately 50 ohms, designated $Z_0$. Similarly, populated section 60 has an effective characteristic impedance of approximately 30 ohms designated $Z_0'$. The connector point pair comprising connector points 50f and 50f' defines the approximate border between populated and empty sections 60 and 62 and represents an impedance discontinuity, as do ends 42 and 45. In order that signals may be transmitted on the transmission line in the shortest possible time without having to wait several transit times for reflections to die out, the transmission line is terminated at all points of impedance discontinuity. To this end, the line is terminated at first end 42 by a resistance 65 corresponding to $Z_0'$ at second end 45 by a resistance 67 corresponding to $Z_0$, and as near as practical to the border discontinuity at connector points 50f and 50f' by a resistance 70 corresponding to $Z_0''$ where $Z_0''$ is given by $1/(1/Z_0' - 1/Z_0)$ so that resistance 70 in parallel with the impedance $Z_0$ of unpopulated transmission line section 62 equals the characteristic impedance $Z_0'$ of populated transmission line section 60.

The actual implementation on the backplane differs from that schematically shown in FIG. 4 in that connections are made to both sides of the daughter board. Therefore, the connection points of a given pair are spaced apart in a direction extending along the direction of the transmission line rather than in a direction transverse thereto. FIG. 5A shows an actual geometric layout for transmission lines 40 and 40' making connections at connector points 50a and 50a', 50b and 50b', and 50c and 50c' (like reference numerals being used to denote elements corresponding to those in FIG. 4).

FIG. 5B shows the geometrical configuration of the transmission line traces according to a modified embodiment that differs from that shown in FIG. 5A in that lines 40 and 40' are effectively "crossed over" between each connector on the backplane so that line 40, rather than coupling to connector points 50a, 50b, 50c, and so on as in FIG. 5A, couples to connector points 50a, 50b', 50c, 50d', and so on. Similarly, line 40' couples to connector points 50a', 50b, 50c', and so on. That is, the signal polarity is alternated on successive connectors so that each successive port receives signals that are alternately of positive and negative polarity. The effect of this is to even out any systematic imbalances between lines 40 and 40', such as imbalances in capacitive loading or in DC loading. Imbalances in capacitive loading of lines 40 and 40' typically results in different effective impedance and propagation velocities, thus tending to convert common mode noise to normal mode noise, while imbalances in DC loading have the effect of reducing the noise margin. The successive alternations of polarity may also provide better equalization of externally induced noise between lines 40 and 40' so as to ensure that any noise induced in the signals is common mode which can be rejected by the differential receivers. This pseudo-twisted pair scheme may help preserve noise margins which is significant in view of the relatively low logic swings employed on these lines (as low as ±0.08 volts). However, it also complicates the port somewhat, since ports in odd-numbered slots must send and receive levels that are the complement of the levels that are sent and received by ports in even-numbered slots. Thus, whether or not the pseudo-twisted pair configuration is to be used depends on the particular requirements of the given system.

Radial Signals

FIGS. 6A and 6B are timing diagrams illustrating the clock, request, and grant signals which are communicated between BCU 22 and port control circuitry 37 on private lines 32i. Reference should also be made to FIGS. 3A-B.

A system clock signal, designated SYSCLK is distributed simultaneously to each port on particular ones of its own private lines 32i. SYSCLK is a squarewave with a period equal to 25 ns which defines the bus cycle. SYSCLK is radially distributed to each port via delay-matched differential 50-ohm line pairs, so that SYSCLK arrives simultaneously at each port. The differential line pairs are brought into each board at the center of the board. Very near the point of entry, SYSCLK is buffered by one or more differential receivers within clock generator 170 to produce a local clock signal, designated TCLK. The low 50-ohm impedance of the clock signal lines prevents rise time degradation due to the lumped capacitance presented by the clock receivers. The clock lines must be terminated carefully to prevent reflections which could result in jitter in clock timing.

From the clock input receivers, the clock signals (TCLK) are distributed to appropriate portions of SBC circuitry 37, and to SBT slices 35. In order to minimize the cycle time, it is very important that the distribution of clock signals must be substantially identical for all the ports in the system. This insures that the signals transmitted and received by all ports are synchronized. Thus, even though there are delays between signals from different SBT slices on the same unit, the delay is consistent from functional unit to functional unit.

TCLK is distributed to the SBT slices from the receivers/buffers located at the center of each port by single-rail lines running toward each edge of the board. The lines are not stubbed, but run directly from the clock inputs of one slice to the clock inputs of the next slice. Thus, each clock line is loaded at regular intervals of about 1.5 inches with the capacitance of one pin (about 5 pf), and extends for a length of approximately 7.5 inches. Assuming that the impedance of the line traces is about 95 ohms, and that the capacitance is about 20 pf/foot, the lines have an effective impedance of about 55 ohms, and should be terminated accordingly. A total propagation delay of about 2 ns results. This total propagation delay shows up as a corresponding delay in the bus signals handled by the port slices, with signals located towards the center of the bus leading those at the outer edges by about 2 ns.

Like TCLK, the bus request and bus grant signals are radially distributed on private lines 32. Two bus request signals are driven radially from port 25 to BCU 22. These signals, designated REQ HI and REQ LO, are driven by standard ECL drivers, and are transmitted on 50-ohm lines on the system backplane. The bus request signal is driven so that a bus request is signified by a high level. The use of two bus request signals is to specify whether the request is a high priority or low priority request.

The bus grant signals (GRANT) are radially distributed by BCU 22 to each functional unit, but since there is no constraint that they arrive simultaneously at all functional units, they are distributed by 50 ohm etch on the system backplane, and are terminated at the receivers. The GRANT signal enters each port near the center of the board, in proximity to SYSCLK, and is received and buffered by ECL logic. The outputs of these circuits are distributed to the control logic in the SBT slices as single-ended signals, in the same manner as TCLK is distributed.

The bus request signals (REQ HI and REQ LO) are shown collectively on FIGS. 6A-B as a signal designated REQ. A given functional unit asserts its request for the bus by setting REQ at a time shortly after a rising edge of TCLK. REQ remains set until after a GRANT signal is received. Where a given functional unit is being granted use of the bus for a given bus cycle, GRANT is high during the rising transition of TCLK.

FIG. 6A shows a situation where the functional unit is requesting use of the bus for one bus cycle only. In such a case, REQ is removed shortly after the GRANT signal is detected, and the GRANT signal is removed shortly thereafter.

FIG. 6B is a similar timing diagram except that it shows a situation where the functional unit is requesting use of the bus for two consecutive bus cycles. In such a case, REQ stays set during the cycle for which GRANT is initially valid, so that GRANT remains high for the entire cycle and then at least until the next rising edge of TCLK, thus granting the functional unit the use of the bus for the succeeding cycle.

Arbitration of competing requests among functional units is governed by two rules. The first is that a REQ HI takes precedence over a REQ LO. The second is that between two requests at the same level (HI or LO) the assignment is made according to any convenient regime (e.g., the functional unit with the lower slot address takes precedence). An additional principle in this implementation of the system is that no functional unit, regardless of position and level of request, can be granted use of the bus for more than two cycles in a row.

FIG. 7 is a logical schematic of those portions of the circuitry within SBT control circuitry 37 for generating the bus request signals. The circuitry receives TRANSMIT, TRANSMIT 2, and HI/LO signals from the functional unit proper, signifying that a request for the use of the bus is to be made, and further specifying whether one or two BIQ's are to be sent and the priority of the request. The circuitry includes REQ HI and REQ LO flip-flops 70a and 70b for clocking the request signals on a rising edge of TCLK. The data inputs to flip-flops 70a and 70b are gated so as to cause the removal of the request after the GRANT is received from the BCU as described above. A third flip-flop 72 is set when the transmission consists of two BIQs and keeps the request active for a extra cycle.

There are two more radial signals, designated USING DATA BUS and USING ACK BUS. When a port receives GRANT, on the next cycle it enables its bus drivers on the bus, and asserts USING DATA BUS on a private line to the BCU. The logical OR of all USING DATA BUS signals is bused to all units as a differential party line signal, designated DATA BUS ACTIVE, to inform all units that the data bus is currently being driven. When a port detects that the TSLOT contained within the BIQ (see data formats below) matches the unit's slot address and that the data bus is active, the unit, on the next cycle, generates an acknowledge code on the ACK bus, and asserts USING ACK BUS on a private line from the unit to the BCU. The logical OR of all USING ACK BUS signals is bused to all units as a differential party line signal, designated ACK BUS ACTIVE.

Bused Signals-Bus Transceivers

The following discussion describes the circuitry within SBT slices 35 for driving and receiving signals on bus lines 30, and communicating such signals with the functional unit proper and the SBC chip.

The BIQ signals, as discussed above, are bused on differential pairs of lines in the system backplane. Each signal is driven by a three-state differential current-mode bus driver 75, a circuit schematic of which is shown in FIG. 8. Driver 75 is capable of selectively sinking 7 ma of current on one of three lines 80a, 80b, and 80c, designated B0, B+, and B−, respectively, depending respectively on the state of logic signals Z, S−, and S+ at respective inputs 85a, 85b, and 85c. Driver gating circuitry, to be described below, operates to ensure that one and only one of inputs 85a-c is high.

B+ line 80b and B− line 80c are coupled to respective lines of a bussed pair on the backplane, while B0 line 80a is connected to ground. Driver 75 includes a constant current source 92 that is coupled to one of lines 80a-c, depending on which of inputs 85a-c is high (S+ high sinks current from B−). Since driver 75 operates into an effective impedance of about 15 ohms (transmission line characteristic impedance of about 30 ohms driven in both directions), the result is an output voltage differential of approximately ±105 millivolts.

Current mode driver 75 has the advantage, unlike a voltage mode driver, of having a very high output impedance (greater than 10 kohms) so that a signal propagating on the bus encounters no significant discontinuity in line impedance when it passes a current mode driver that is "on" (that is, sinking current on one of the bus line pair). Voltage mode drivers, on the other hand, have low output impedance, and therefore reflect any signals which encounter them.

The most significant advantage of current mode transmission is that no "settling time" is required when "turning around" the bus. That is, it is not necessary to wait for the signal level change resulting from a device's turning off its bus drivers to propagate the end of the bus before allowing another device to enable its bus drivers to transmit on the bus. To understand the need for such settling time in the case of a voltage mode bus driver, consider the case in which a driver located at one end of the bus has just finished sending a signal, and a driver at the other end is to send a signal during the next bus cycle. Assume that the first driver turns off at time T=0, and that the second driver turns on at the same time. If the propagation delay for a signal from one end of the bus to the other is $T_d$, then at $T=T_d$, the signal sent by the second device will have reached the far end of the bus, and at the same time, the level change resulting from the first driver's turning off will have reached the second device. At this time, the signal change resulting from the turn off of the first device is reflected from the low output impedance of the second device, and produces a brief surge which must travel back down the bus before the new signal level is established throughout the bus. Thus, the voltage mode bus requires a time equal to twice $T_d$ to turn around the bus and establish a new signal level throughout. By contrast, no reflection occurs in a similar current mode bus since the second device which has turned on does not present a low impedance on the line, and thus does not cause a signal reflection. Thus, the current mode bus can be turned around in a time of $T_d$.

Another advantage of current mode transmission is that, assuming high sensitivity receivers are available (which is the case as will be described below), it does not require the very high output currents which are required on voltage mode buses when driving lines with low effective characteristic impedances. The voltage mode drivers are typically required to generate relatively high voltage swings since their output levels are determined by loosely controlled parameters such as transistor base-emitter voltage drops and the like. Therefore, if the signal swing is reduced to a low value, the worst case minimum "HIGH" level for the output driving one line of a pair may be lower than the worst case maximum "LOW" level of the output driving the other line of the pair, resulting in error. By way of contrast, current mode driver output levels are defined by an output current that is drawn from one line or the other which, in turn, produces a voltage change, rather than an absolute voltage level, on one or the other lines. Assuming that both lines are terminated to the same DC voltage source, the resulting differential "HIGH" and "LOW" voltage levels will always be distinct, even when their values are small. The practicality of low output currents for current mode bus drivers reduces power requirements for the drivers, and allows a much higher packing density for the drivers.

Current mode offers yet another advantage in reduced noise sensitivity. One source of the improvement is that since, as explained above, the ratio of worst-case differential output voltage to total output voltage swing is higher for current mode than for voltage mode, the noise produced by cross-talk between adjacent signals and any noise that might be caused by partial reflection due to line impedance discontinuity is a smaller percentage of worst-case differential signal level for current mode than for voltage mode.

As indicated above, and as shown in FIG. 4, the bus lines are terminated at a DC voltage $V_T'$ which determines the voltage levels of the signals. The maximum and minimum voltage levels that can be present on any signal line are determined by the maximum range of voltages under which the port slice driver and receiver circuits may operate. The maximum voltage level is determined by the requirement that the receiver circuit's input devices not be saturated. Saturation occurs if the voltage on the signal line exceeds +0.3 volts. The minimum voltage on the signal lines is determined by the requirement that the transistor in current source 92 in driver 75 not be saturated. Saturation occurs if the voltage on the line is lower than approximately −2.4 volts. Thus, there is a voltage range of approximately 2.7 volts within which the signal levels must lie. With current values that are within 30% of the nominal value and line impedances that are within 10% of the nominal value, and allowing for the possibility that two drivers may be simultaneously sinking current from a line during turnaround, the maximum signal swing is approximately:

2*(130%*7 ma)*(110%*15 ohms)=0.3 volts

For optimum noise tolerance, it is desirable that this signal swing be centered in the range of −2.4 to +0.3 volts as discussed above. This may be accomplished if the more positive signal level is about −0.9 volts. Since the more positive signal level is determined by the voltage to which the line is terminated while the more negative signal level falls below that when current is drawn into the driver, this defines the optimum line termination voltage $V_T$. It will be noted that this provides a worst case common mode noise margin in excess of one volt. The voltage drop provided by a biased silicon diode, approximately 0.8 volts, is a convenient source of this termination voltage and does not substantially impair the noise margin.

FIG. 9A is a logical schematic illustrating driver gating circuitry 100 operable to provide suitable voltage levels for Z, S+, and S− lines 85a-c to control current driver 75. Driver gating circuitry 100 has enable input lines 102a and 102b, designated $\overline{E1}$ and $\overline{E2}$, respectively, a conditional inversion line 105, designated I2, and data input lines 107a and 107b, designated D1 and D2, respectively.

Driver gating circuitry 100 is operable to place a high level on one and only one of output lines 85a-c so that the current may be steered appropriately, as discussed above. $\overline{E1}$ and $\overline{E2}$ enable lines 102a-b are gated so that if either is high, Z is high, and S+ and S− are both low. Assuming both $\overline{E1}$ and $\overline{E2}$ are low, Z is low, and exactly one of S+ and S− is high, depending on D1, D2, and I2. I2 performs a selective switching function in that S+ corresponds to D1 when I2 is low, and corresponds to the complement of D2 when I2 is high.

For the regular current driver application, enable inputs 102a-b are connected and data inputs 107a-b are connected to provide, in effect, a single enable input and a single data input. Then S+ corresponds either to the data input or its complement, depending on I2. That is, circuitry 100 performs an exclusive-OR function, or, put another way, I2 performs a selective inversion of the data input. The selective inversion is necessitated by the use of pseudo-twisted line pairs as described above. The level on I2 is conveniently alternated from connector to connector by distributing either a pair of different DC levels on a pseudo-twisted line pair in the manner described above, or a single DC level on a single line which couples to every second connector.

While it is straightforward to describe and specify the operation of driver gating circuitry 100 in terms of logical gates as shown in FIG. 9A, there are several technical problems in implementing such circuitry. The general problem is speed, because propagation delays through multiple gating stages significantly slow down the response of the circuitry and the possible speeds obtainable on the bus. Moreover, in order that full voltage may be developed on the bus, it is required that there be minimum overlap of high levels on Z, S+ and S− lines 85a-c. Also, in order that current driver 92 not become saturated, there must be substantially no overlap of low signals. If all three of the lines were to be low for any significant duration, the transistor in driver current source 92 could saturate, so that when one of lines 85a-c went high, the response would be slow. Saturation could also have the effect of draining the bias supply $V_{cs}$ which would degrade performance of other circuitry on the chip.

FIG. 9B is a circuit schematic of the precise circuitry used to implement driver gating circuitry 100 to provide essentially a one-stage circuit having minimum overlap at high levels of the outputs and substantially no overlap at low levels of the output. Broadly, the gating is carried out by current steering rather than passing the signals through multiple gating stages.

Z, S+, and S− are the outputs of respective emitter followers having respective internal bus inputs 85a', 85b', and 85c' designated Z', S+', and S−', respectively. Driver gating circuitry 100 utilizes first and second current sources 110 and 112, and respective first and second current steering networks 115 and 117, each of which includes a differential transistor pair (hereinafter called a "differential pair").

D1 controls a first differential pair 120 tied to S+' and S−' while D2 controls a second differential pair 122 tied in the reverse order to S+' and S−'. Current steering network 117 is controlled by I2, and steers current source 112 to either of the two differential pairs so that one or the other of S+' and S−' is pulled low. $\overline{E1}$ and $\overline{E2}$ control current steering network 115 to steer current source 110 to pull either Z' low (leaving one of S+' and S−' high), or to pull the higher of S+' and S−' low (leaving Z' high and both S+' and S−' low). When only one of the $\overline{E}$ inputs 102a and 102b is used, the other is eliminated by tying it to the emitter of its input transistor 102c.

FIG. 10A is a logical schematic illustrating receiver circuitry 130 operable to provide complementary logic level outputs on a pair of output lines 132a and 132b, designated Q and $\overline{Q}$, respectively, in response to voltage swings on the bus. Receiver circuitry 130 has input lines 135a and 135b, designated B+ and B− (input from the bus corresponding to B+ and B− lines 80b−c in driver 75) and a conditional inversion line 137, designated I1. The voltage difference at input lines 135a−b is amplified by two differential amplification stages 140 and 142, with the output being gated by I1 in an exclusive-OR gate 145.

FIG. 10B is a circuit schematic of the precise circuitry used to implement receiver 130 such that the propagation delays are minimized. Differential amplification stage 140 comprises a differential pair that steers current from a source 150. Differential amplification stage 142 comprises first and second parallel differential pairs 142a and 142b, both of which receive as inputs the output signals from differential pair 140 through appropriate emitter followers 151a and 151b. Each of differential pairs 142a and 142b has its outputs coupled to Q and $\overline{Q}$ through appropriate emitter followers 152a and 152b. However, the outputs of differential pairs 142a and 142b are coupled to Q and $\overline{Q}$ with opposite polarities. A current steering network 154 is controlled by I1 and steers current from a constant current source 155 to activate one or the other of differential pairs 142a−b. Stage 140 serves, in addition to its preamplification function, the important function of limiting the range of voltages which the more positive input to stage 142 may assume. This prevents saturation of the current-steering transistors in network 154. Thus, I1 has the effect of controlling the output polarity to provide selective inversion as necessitated by the use of pseudo-twisted line pairs as described above. The level on I1 is alternated from connector to connector in the manner described above with reference to I2.

Bused Signals-SBT Slice Logic

In addition to the current drivers and differential receivers described above, SBT slices 35 include appropriate send and receive registers and the control logic necessary to implement primitive bus protocol operations such as slot address recognition and synchronization of the send and receive registers with the system clock signals.

FIG. 11A is a logical schematic illustrating circuitry within SBT slice 35 for communicating data from the functional unit proper to bus driver 75. While the SBT slice includes circuitry for driving signals on nine bus line pairs, the circuitry for just one line pair will be shown, along with the control circuitry common to the port slice. Broadly, data from the functional unit is received at a SEND input and is loaded into either of two registers, an A-register 170a and a B-register 170b, the contents of which may be selectively communicated to the bus. A-register 170a is implemented with a 2:1 multiplexer 172a and a flip-flop 173a while B-register 170b is similarly implemented with a 2:1 multiplexer 172b and a flip-flop 173b. The outputs of flip-flops 173a and 173b are communicated to respective data inputs of driver gating circuitry 100 which in turn communicates with current mode driver 75 as described above. Each flip-flop output is also communicated back to one of the multiplexer data inputs.

Load selection circuitry 174 receives LOAD ENABLE and LOAD B signals from port control circuitry 37 to effect the selective loading of registers 170a and 170b by communicating appropriate signals to the select inputs of multiplexers 172a and 172b. It should be noted that unless loading is enabled, each register holds its own value due to the connection from the flip-flop output to one of the multiplexer inputs.

Transmit selection circuitry 175 receives a GRANT signal and a SELECT A signal and clocks these to the enable and conditional inversion inputs of driver gating circuitry 100 to determine which of registers 170a and 170b gets sent on the bus. It will be noted that the outputs from flip-flops 173a and 173b are communicated to the data inputs with opposite polarity to achieve a true multiplexing function without inversion. Flip-flops 173a and 173b are clocked by TCLK, as are the flip-flops within transmit selection circuitry 175.

FIG. 11B is a logical schematic illustrating the circuitry within port slice 35 for communicating data from bus receiver 130 to a RCV output which is communicated to the functional unit and, for some bits, also to a DIRECT output which is communicated to port control circuitry 37. As with FIG. 11A the circuitry for only one bit of data is shown. Broadly, the incoming data is clocked into a flip-flop 177 (designated "SR register") and is placed in a 4-deep FIFO stack 180, the data in the stack being communicated to the functional unit (and SBC logic). SBC circuitry 37 is responsible for maintaining read and write pointers for proper stack management. More specifically, data from the bus line pair is received at receiver 130 and communicated to SR flip-flop 177, the output of which is communicated to FIFO stack 180 which comprises four latches 181, 182, 183, and 184 which are connected in parallel to define the stack registers. The latch outputs are multiplexed with the 4:1 multiplex function being implemented by first and second 2:1 multiplexers 185a and 185b. A FIFO bypass multiplexer 187 receives as inputs the outputs from multiplexers 185a−b and from SR flip-flop 177, thus allowing either a FIFO register or the current bus data to be read.

Write select circuitry 190 receives signals WA0, WA1, and WA2 representative of the write pointer from port control circuitry 37, and decodes this information to supply signals at the latch enable inputs to select which, if any, of latches 181-184 is to be written into. Read select circuitry 195 receives signals RA0 and RA1 from port control circuitry 37, and communicates this information to the select and enable inputs of multiplexers 185a and 185b. It will be noted that FIFO stack 180 is enabled when TCLK is low.

As discussed above, each port slice contains nine drivers and receivers with associated A and B registers and FIFO stack registers. Each slice also contains a tenth driver and receiver, without associated A and B registers and FIFO stack registers. The input to the driver gating circuitry and the output from the receiver are flip-flops that are clocked by TCLK, thus rendering the tenth driver and receiver operable to send and receive a so-called "simple bit" of information. The simple bits are used for the ACK and system control signals.

FIG. 12 is a logical schematic illustrating portions of the circuitry within at least one of port slices 35 for correlating the TSLOT field on the bus with the functional unit's hardwired slot address (see description of bus data formats below). For those portions of the circuitry that were described above, like reference numerals are used except that alphabetic designators are appended thereto to distinguish duplicated elements. In the preferred embodiment, this circuitry is present in all the SBT slices, but only one of the SBT slices is operated in a mode to carry out the correlation. This is determined by a signal designated TSLOT MODE which is high for one of the port slices, designated the "Mode 1" slice, and low for the remaining slices, designated "Mode 0" slices.

Mode select circuitry 220 provides a signal, designated SMODE which is communicated to slot generation circuitry 225. Slot generation circuitry 225 receives as inputs the hardwired slot address, designated SLOT-0–SLOT4, and in the TSLOT mode generates corresponding signals S0–S4 and a slot parity signal SP. S0–S4 are communicated to respective I1 inputs of five receivers 130a–130e while SP is communicated to the I1 input of a sixth receiver 130f. The outputs of receivers 130a–e are communicated to flip-flops 177a–e as described above. The negative outputs of flip-flops 177a–e are communicated to FIFO stacks 180a–e in the manner described above and to FIFO bypass multiplexers 187a–e. The positive outputs of flip-flops 175a–e are OR'ed together to provide a signal, designated $\overline{\text{MATCH}}$, which is low whenever the received signals match S0–S4.

In the TSLOT mode, FIFO bypass multiplexers 187a–e are disabled. It will be appreciated that receivers 130a–e perform an exclusive OR function between the differential bus signals and the slot address signals S0–S4, so that $\overline{\text{MATCH}}$ is low only when all the slot address bits correspond with the bus bits. Slot verification circuitry 230 receives as its inputs the bused slot parity (R5) and $\overline{\text{MATCH}}$ to determine whether a valid slot detection has occurred.

FIG. 13 is timing diagram illustrating the BIQ and ACK signals relative to TCLK. A first functional unit places its BIQ signals on the bus in response to the rising edge of TCLK and removes its BIQ signal from the bus at the next rising edge of TCLK. The BIQ signal is shown as a single signal in FIG. 10, but it should be remembered that only one of a BIQ line pair is negative, with the polarity possibly being port-position-dependent. A second functional unit (that is to receive the information) strobes the data on the rising edge of TCLK. It should be noted that at this point, the first functional unit is already removing its information from the bus but this fact has not yet propagated to the second unit.

The acknowledgement (ACK) signals are then generated by the receiving SBC logic to acknowledge receipt of the BIQ. Such ACK signals are not to be confused with "responses," which are generated by the functional unit after processing the received BIQ. Responses will be discussed in detail below.

The ACK signals, shown collectively as a single signal, are also transmitted at the next rising edge of TCLK and are valid for one cycle. The sending functional unit post strokes the ACK lines at the rising edge of TCLK in the next clock cycle. The ACK signals lag behind their corresponding BIQ by two clock cycles. Since the ACK signals use the "Simple Bit" channels and the BIQ uses the regular data channels, this lag allows the bus to function at a maximum rate. A fuller description of the ACK signals will be set forth below in connection with the description of the SBC circuitry.

System Control Signals

The three System Control Signals are each driven as party line signals on pairs of lines that are bused to all ports. They are sent in the "simple bit" channels of three SBT ports, and their timing is identical to all other party line signals. These signals, designated RESET, AC LO, and DC LO, will now be described.

RESET is used to provide a reset signal for all functional units so that all the units and control logic may be set into a known state.

AC LO is used to inform the functional units that a power failure is imminent, thus indicating that each unit should begin to save the state of whatever process is active on that unit.

DC LO is used to inform the functional units that the DC supply is about to fail so that a very small amount of time is left before the machine fails. This signal resets the port and forces a reset to the functional unit proper.

Bus Data Formats

The following discussion describes the formats that are used for communication between functional units via bus lines 30. First the ACK formats will be described, and then the BIQ formats.

The ACK signals provide a 2-bit binary code representing the success with which the transmitted BIQ was received. The codes are as follows:

| ACK 1 | ACK 0 | |
|---|---|---|
| 0 | 0 | BIQ received all right |
| 0 | 1 | received BIQ had a parity error |
| 1 | 0 | receiving functional unit is busy |
| 1 | 1 | receiving functional unit is broke |

As discussed above, the fundamental unit of system communication (that is, a "bus word") is the Bus Information Quantum (BIQ). One device can transfer one BIQ to another device via the bus each bus cycle (25 ns). However, it should be noted that the BIQ contains more bits than the standard 64-bit computer word.

A series of one or more consecutive BIQ's, transmitted by the same sender to the same recipient and together constituting a single communication, make up what will be called a transfer. Transfers, in turn, can be of either of two types, called "operations" and "responses." Operations are transfers which are sent on the initiative of the sender to cause another device to perform some operation. Responses are transfers which are returned to the sender of an operation by the recipient of that operation after it has taken appropriate action.

As will be described in more detail below, there are six data operations, five message operations, and five responses as follows.

| | |
|---|---|
| Data Operations: | Read |
| | Write |
| | Exchange AND |
| | Exchange OR |
| | Exchange Write |
| | Two Word Read |
| Message Operations: | Message Send |
| | Small Message Send |
| | Small Hardware Send |
| | Received and Release Buffer |
| | Received and No Release |
| Responses: | Normal Data Response |
| | Two Word Read Response |
| | Message Response |
| | Data Error Response |
| | Invalid Operation Response |

The format of a BIQ is shown below:

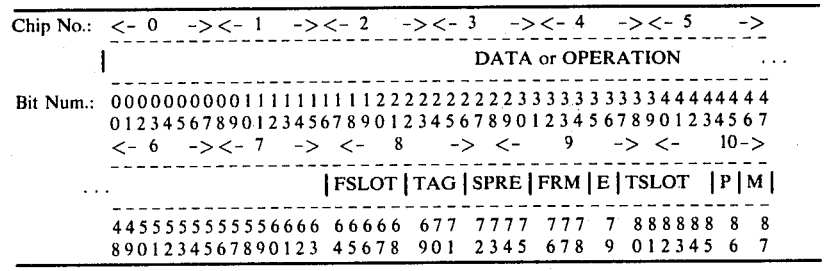

The chip number refers to which of the eleven SBT slices sends and receives the particular bits. Chips 1-9 operate in Mode 0; chip 10 in Mode 1. Each SBT slice includes, in addition to its eight information bits, one parity bit, and a simple bit channel.

As shown above, the BIQ consists of eight "control fields," designated FSLOT, TAG, SPRE, FRM, E, P, TSLOT, and M together with a 64-bit field labeled "Data or Operation," the content of which depends upon the content of the control fields. A transfer consists of one or two consecutively transmitted BIQ's. The significance of each of the control fields is explained immediately below. The contents of the variable field of each BIQ of a transfer will then be defined for the various transfer types.

The 5-bit FLSOT field defines the functional unit that the BIQ originated from, and corresponds to the unit's slot address. The recipient of the transfer would use this slot address to address any necessary response.

The 5-bit TSLOT defines the functional unit which is the destination address of the BIQ. During each bus cycle, every port examines the state of the bus lines corresponding to these bits and compares their value to that unit's slot address to determine whether the BIQ is addressed to that unit. In addition the 6 bit TSLOT field includes odd parity.

The 3-bit TAG field is included in all BIQ's of any transfer which specifies an operation, and is returned unaltered by the recipient in any transfer sent in response to that operation. The functional unit that initiates an operation is free to define the TAG field as it wishes; the responding functional unit attaches no significance to its value, but merely remembers the value received and echoes that value in any response. The purpose of the TAG field is to allow a functional unit to initiate up to eight operations without waiting for responses from each in turn, and yet be able to unambiguously determine to which operation a given response applies. Thus, a CPU could initiate a memory read to prefetch instructions, a second read to fetch one operand, and a third to fetch a second operand, and so long as each operation were sent with a different TAG field, the CPU would be able to unambiguously identify the returning data.

If a functional unit initiates an operation prior to receiving a response to any previous operation, there is no guarantee that the responses to the outstanding operations will be received in the order in which the operations were transmitted, even if the operations were addressed to the same unit. In order to identify responses, a unit must send a different TAG code with each outstanding operation to which a response is expected.

The TAG field also permits the functional unit originating an operation to enhance its own efficiency by assigning the TAG code so that it bears a relation to where the response should be routed within the unit. For example, a CPU might allocate half of the TAG codes to its cache, and half to its ALU.

The 3-bit FRM (format) field defines the format of the 64-bit Data/Operation field and also specifies whether the BIQ is the final BIQ of a transfer or is followed by another. The values for the FRM field are defined as follows:

| Bit | | | |
|---|---|---|---|
| 76 | 77 | 78 | Format |
| 0 | 1 | 1 | Begin operation (extended) |
| 1 | 1 | 1 | Operation extension |
| 1 | 1 | 0 | Single BIQ operation |
| 0 | 0 | 1 | Begin response (extended) |
| 1 | 0 | 1 | Response extension |
| 1 | 0 | 0 | Single BIQ Response |

Bit 76 is 0 if another BIQ follows, 1 for final BIQ of a transfer. This bit is also called TERM.

Bit 77 is 1 for an operation transfer, 0 for a response transfer. This bit is also called OPER.

Bit 78 is 0 for a single BIQ transfer, 1 for a two BIQ transfer.

The M (maintenance) bit is 0 in all normal transmissions; M=1 indicates a maintenance transfer. A maintenance transfer generally is transmitted only by the SVP. The M bit serves a dual purpose. The first function is an override transfer in combination with the operation/response (OPER) bit in the FRM field, and is to notify a functional unit that it should respond to a maintenance command from the SVP, even if the unit is busy or has its BROKE flag set. The override transfer informs the unit to accept only commands from the SVP, and that all other transfers directed to the unit should be NACKed (non-acknowledged). Extreme caution must be employed in the use of override transfer since it may cause the receiving unit to overwrite queued-up incoming transmissions and/or to abort operations in progress in a non-recoverable manner.

The second function of the M bit is identify commands from the SVP that are directed to the functional unit's maintenance hardware. These commands are flagged by the M bit so that the functional unit can uniquely identify transfers from the SVP immediately. Thus the functional unit can NACK all transmissions that did not come from the SVP when the functional unit is in the mode of accepting maintenance commands only.

The E (error) bit indicates that the current response is an error response to a received operation transfer. A functional unit that is transmitting a response should set the E bit when it could not successfully complete a requested operation transfer, as for example when a data failure or an illegal operation transfer prevented the unit from completing and sending a normal response.

The P (phantom) bit is set to specify that the transmission is a phantom transmission. A phantom transmission is acknowledged in the same manner as a normal transmission, but the transmission actually does not get placed in the receiving port's FIFO stack. By using a phantom transmission, the SVP can poll units and test the bus integrity without having to disturb the state of the system while it is running.

The data and message operations will now be described.

In addition to the FSLOT, TAG, SPRE, FRM, TSLOT, P, and M fields, a data operation BIQ includes fields designated PROCESS ID, BYTEMASK, OP, CNT, WORD ADDRESS. The first BIQ of a data operation always conforms to the following format:

```
Chip No.:  <- 0  -><- 1  -> <- 2  -> <- 3   -> <- 4  ->
           ------------------------------------------------
           |    PROCESS ID    | OP |CNT|BYTEMASK |----|WORD...
           ------------------------------------------------
Bit Num.:  0000000000111111 1111 2222 22222233 3333 3333
           0123456789012345 6789 0123 45678901 2345 6789

<- 5  -><- 6  -><- 7 -> <- 8  ->  <-  9   -> <- 10  ->
           ------------------------------------------------
    ...         ADDRESS        |FSLOT|TAG|SPRE|FRM|E|TSLOT  |P|M|
           ------------------------------------------------

..|                        |FSLOT|TAG|SPRE|1 1 1|0|TSLOT  |P| 0|
           ------------------------------------------------
           4444444444555555555566666 66666 677 7777 777 7 888888 8 8
           0123456789012345678901230 45678 901 2345 678 9 012345 6 7
```

The FRM field must be either 110 for single-BIQ operations, or 011 for 2-BIQ operations. For 2-BIQ operations, the second BIQ always contains data in bits 0–63, and has FMR=111. As in all 2-BIQ transfers, the TAG and TSLOT fields must be the same in both BIQ's, and M=0 except in a maintenance transfer.

The 16-bit PROCESS ID field identifies the Process ID of the sender. All processes must be assigned their own Process ID's in order to communicate with other processes. Although most recipients make no use of this field (exceptions: Messenger and Scheduler), all operations must include this identification in order to allow software-transparent diagnostic and performance monitoring by special trace hardware.

The 8-bit BYTEMASK field contains one bit for each byte of the 64-bit hardware word, and defines which bytes of the addressed word are to be operated upon by the operation. For example, a Write operation modifies only those bytes of the addressed word indicated by a 1 in the corresponding bit of the BYTEMASK field sent with the operation, while in a Read operation the BYTEMASK is ignored. Bytes of data are not compacted according to the BYTEMASK field; rather, they are sent and received in their usual positions within a word. The recipient of a response must right-justify bytes received, if required.

The 4-bit CNT field for data operations is a reserved field and is not implemented. A typical use would be to contain a number between 0 and 15 (decimal) which is one fewer than the number of words to be operated on by the operation. Thus, for a single-word Read operation, the CNT field would contain 0, while a 3 in the CNT field would indicate a 4-word operation.

The 28-bit WORD ADDRESS field contains the address of the (first) 64-bit hardware word to be operated on by the operation. For multi-word operations, addresses for subsequent words are obtained by incrementing the word address for each subsequent word.

The 4-bit OP field contains a 4-bit operation code that defines the operation to be performed by the recipient of the transfer as follows:

| | Bit | | | |
|---|---|---|---|---|
| 16 | 17 | 18 | 19 | |
| | | | | Data Operation |
| 0 | 0 | 0 | 0 | Undefined |
| 0 | 0 | 0 | 1 | Undefined |
| 0 | 0 | 1 | 0 | Write |
| 0 | 0 | 1 | 1 | Read |
| 0 | 1 | 0 | 0 | Exchange OR |
| 0 | 1 | 0 | 1 | Exchange AND |
| 0 | 1 | 1 | 0 | Exchange Write |
| 0 | 1 | 1 | 1 | Two Word Read |
| | | | | Message Operation |
| 1 | 0 | 0 | 0 | Message Send |
| 1 | 0 | 0 | 1 | Small Message Send |
| 1 | 0 | 1 | 0 | Hardware Send |
| 1 | 0 | 0 | 0 | Received and Released Buffer |
| 1 | 1 | 0 | 0 | Received and No Release |
| 1 | 1 | 0 | 1 | Undefined |
| 1 | 1 | 1 | 0 | Undefined |
| 1 | 1 | 1 | 1 | Reserved |

The message operation transfers can be distinguished from data operation transfers by bit 16, which is 1 for message operation transfers and 0 for data operation transfers.

The following paragraphs define the six data operations tabulated above. Where the operation is sent in a single BIQ, FRM=100, while if a second BIQ is required for data, FRM=011 for the first BIQ and FRM=111 for the second BIQ.

Read is a 1-BIQ operation that directs the recipient to read the addressed data and return it to the sender in one or more responses.

Write is a 2-BIQ Operation that directs the recipient to replace the data in the addressed location with the data sent in the second BIQ of the operation. As with the AND and OR operations, no response is expected to the Write operation except in the case of error. It is strongly recommended that all Write operations used in combination with the BYTEMASK use the Exchange Write operation since a partial word write requires the memory controller to perform a read before write. If there is a data error on the read, the originator of the Write operation will receive a response that is unexpected.

Exchange AND is a 2-BIQ operation that directs the recipient to perform a Read operation, as defined above, and then perform an AND operation on the same location. The effect of this operation is to retrieve the data from a location and then clear certain bits in the location in such a manner that no other process could change the data in the meantime. In the Exchange AND, as well as the other Exchange operations listed below, the BYTEMASK field is applied only to the second part of the operation. The Read part of the Operation is performed as though the BYTEMASK field were all 1's, so that the entire contents of the addressed word are returned in response to the sender.

Exchange OR is a 2-BIQ operation that directs the recipient to perform a Read operation, as defined above, and then perform an OR operation on the same location. The effect of this operation is to retrieve the data from a location and then set certain bits in the location in such a manner that no other process could change the data in the meantime.

Exchange Write is a 2-BIQ operation that directs the recipient to perform a Read operation on the addressed location followed by a Write of data supplied by the sender in the second BIQ of the operation.

Two Word Read is a 1-BIQ operation that directs the recipient to read the addressed location and the next sequential location and return both words to the sender in a single 2-BIQ transfer. The word address for the Two Word Read must have the least significant bit equal to 0. Thus the Two Word Response will contain in the first BIQ the even Word Address data and the second BIQ will contain the odd Word Address data. Only those bytes of each location for which the corresponding bit the BYTEMASK is 1 need be returned in the response. The presence of a 0 in the bit for a particular byte, informs the recipient that the byte position will be ignored in the response. The BYTEMASK will be applied to both of the addressed words.

The message operations will now be described. In addition to the FSLOT, TAG, SPRE, FRM, TSLOT, P, M, and PROCESS ID fields, a message operation BIQ includes fields designated OP, CNT, R Process ID, and R VERSION ID. The first BIQ of a message operation always conforms to the following format:

```
Chip No.:    ← 0 → ← 1 →       ← 2 →     ← 3 → ← 4 →

BIQ #1 |     PROCESS ID        OP  |CNT  |R PROCESS ID |...

BIT #2 |                                                ...

Bit Num.:    0000000000111111   1111  2222  2222223333333333
             0123456789012345   6789  0123  4567890123456789
             ← 5 → ← 6 → ← 7 →         ← 8 →        ← 9 →            ← 10 →

...|         R VERSION ID      |FSLOT| TAG  |SPRE|  011

...|                           |FSLOT| TAG  |SPRE|  111   |0|  TSLOT  |P|  0|

4444444444555555555566666  66666  677   7777   777   7   888888   8   8
             0123456789012345678901234   45678  901   2345   678   9   012345   6   7
```

The FRM field must be either 110, for single-BIQ operations, or 011, for 2-BIQ Operations. For 2-BIQ operations, the second BIQ is an extension, containing the remainder of the message information in bits 0–63, and has FRM=111. As in all 2-BIQ transfers, the TAG and TSLOT fields must be the same in both BIQ's. For message operations the M bit must be 0.

The 16-bit R PROCESS ID field contains the Process ID of the process that is to receive the transfer. Note that the PROCESS ID field, as above, refers to the process sending the transfer.

The 24-bit R VERSION ID field contains the Version ID of the process that is to receive the message.

The CNT field contains a number between 0 and 15 (decimal) which is one fewer than the number of message buffers to be operated on by the operation. Thus if the number of buffers is 1, CNT=0, while CNT=3 would indicate a 4-buffer message.

The 4-bit OP field contains a 4-bit code that defines the operation to be performed by the recipient of the transfer as tabulated with the data operations above. Message operations will now be described.

Message Send is a 2-BIQ operation that signals the recipient that another process is sending a message to a process attached to the domain of the recipient. The second BIQ of this 2-BIQ transfer contains in bits 0–7 the funnel ID that the message is to be received on, and bits 32–63 contain the Grand Physical Address of the message buffer(s) on an 8-word boundary. The recipient of the operation should check to see if the receiving process exists in the recipient's domain, and if the requested funnel is enabled. Upon checking these conditions the recipient should send a message response that reflects the results of these checks, and attach the message to the funnel for the process.

Small Message Send is a 2-BIQ operation that signals the recipient that another process is sending a message and that the actual message is contained in the body of this transfer and the number of bytes is indicated in the CNT field. In the second BIQ of this 2-BIQ transfer, bits 0-7 contain the funnel ID that the message is to be received on, bits 8-23 contain the sender's link code, and bits 24-63 contain the body of the message (5 bytes). The recipient of the Small Message Send operation should check that the receiving process exists in the recipient's domain, that the requested funnel is enabled, and that there exists a message buffer for the body of the message. Upon completion of these checks, the recipient should send a message response that reflects the results of the checks, and place the body of the message into a message buffer, and attach the buffer to the requested funnel.

Hardware Send is a 2-BIQ operation that signals the recipient that another process has information to be conveyed to the hardware on this functional Unit. The second BIQ of this operation contains the information to be conveyed. The recipient of the operation should check that the receiving process ID is the hardware of this functional unit, and if it does, act on the information contained in the second BIQ. After acting on the second BIQ the recipient should send a message response reflecting the status of the initial check, and the status of the outcome of its acting on the second BIQ.

Received and Release Buffer is a 2-BIQ operation that notifies the recipient that a message that was sent by the process identified by the R PROCESS ID field was received by the process identified by the PROCESS ID field. Upon receipt of this operation the recipient should decrement its global count of message buffers held, reattach the returned buffers to the global pool, next check to see if the process corresponding to the R PROCESS ID field exists in the recipient's domain, and if it doesn't the recipient should transmit a message response that indicates that the process doesn't exist here. If the process does exist, then the recipient should decrement the number of buffers that R PROCESS ID has in transit by the value in the CNT field, and return the buffer(s) pointed at by the Grand Physical Address to the free buffer pool. The recipient then should transmit a message response, that indicates successful completion.

Received and No Release is a 1-BIQ operation that notifies the recipient that a message that was sent by the process identified by the R PROCESS ID field was received by the process identified by the PROCESS ID field. Upon receipt of this operation the recipient should check to see if the process corresponding to the R PROCESS ID field exists in the recipient's domain, if it doesn't the recipient should transmit a message response that indicates that the process does not exist here. If the process does exist, then the recipient should decrement the number of buffers that R PROCESS ID has in transit by the value in the CNT field but the number of global message buffers attached to this unit remains unchanged. The recipient then should transmit a message response, that indicates successful completion.

The responses will now be described. Responses are transmissions that are sent by the recipient of an operation transmission. In general the sender of an operation will be waiting for the response of the operation transfer. Because a functional unit can have many outstanding operations that are waiting for responses, the responding unit must echo back some of the information in the operation transfer to the sender, so that the sending unit can detect the response and match it with a corresponding outstanding operation transfer. The information needed to be echoed back are the TAG and the FSLOT fields. The responding functional unit takes the FSLOT of the operation transfer, and places it in the TSLOT of the response transfer, and places its own slot address in the FSLOT field.

The Normal Data Response to an operation consists of a 1-BIQ transfer having FRM=100 and containing the requested data in bits 0-63.

The Two Word Read Response to an operation consists of a 2-BIQ transfer having an FRM=001 for the first BIQ and FRM=101 for the second BIQ. The first word of the requested data is in bits 0-63 of the first BIQ, the second word in bits 0-63 of the second BIQ.

The Message Response is a 1-BIQ transfer sent in response to a Message Send operation, and has the format shown below.

```
Chip No.:    ←0→ ←1→              ←2→ ←3→ ←4→ ←5→
             ----------------     ------  ------------------------------------
             |  PROCESS ID   |OP |
             ----------------     ------  ------------------------------------
Bit Num.:    0000000000111111  1111      2222222222333333333344444444
             0123456789012345  6789      01234567890123456789012345 67
             ←6→ ←7→           ←8→       ←9→                    ←10→
             ----------------  ------    ------  ----  --  ---------  --  -
         ...|    CCODE      | |FSLOT|  TAG |SPRE|  100 |1| TSLOT  |P|  0|
             ----------------  ------    ------  ----  --  ---------  --  -
             4455555555556666  66666     677    7777   777  7  888888    8   8
```

The 16-bit CCODE (completion code) field indicates whether the message operation was successfully completed, or if it wasn't successful what the type of error was. The list of valid completion codes follows.

| State of Completion | CCODE (HEX) |
|---|---|
| normal | 0000 |
| process not in domain | 0001 |
| receiver's funnel not enabled | 0002 |
| receiver process dead | 0004 |
| no message buffers available | 0008 |

The OP field reflects the OP field of the operation transfer that generated the response.

The E bit is set for any message response that is an abnormal response. The actual error code is present in the CCODE field. The recipient of the response could use the E bit to generate a branch to an exception handler.

The Data Error Response is a 2-BIQ response issued by a device when a correctable or an uncorrectable data error is detected in performing an Operation. The format is as follows:

| Chip No.: | ←0→ ←1→ | | ←2→ | | | | ←3→ | | ←4→ | |
|---|---|---|---|---|---|---|---|---|---|---|
| BIQ #1 | PROCESS ID | |OP| | CNT | |SYNDROME| | ----- | |WORD | ... |
| BIQ #2 | | | DATA | | | | | | | |
| Bit Num.: | 0000000000111111 | 1111 | 2222 | 22222233 | 3333 | 3333 | | | | |
| | 0123456789012345 | 6789 | 0123 | 45678901 | 2345 | 6789 | | | | |
| | ←5→ ←6→ ←7→ | | ←8→ | ←9→ | | ←10→ | | | | |
| ... | ADDRESS | |FSLOT| | TAG | |SPRE| | 001 | |1| | TSLOT | |P| 0| |
| ... | DATA | |FSLOT| | TAG | |SPRE| | 101 | |1| | TSLOT | |P| 0| |
| | 4444444444555555555566666 | 66666 | 677 | 7777 | 777 | 7 | 888888 | 8 | 8 | |
| | 0123456789012345678901234 | 45678 | 901 | 2345 | 678 | 9 | 012345 | 6 | 7 | |

The PROCESS ID field is copied from the PROCESS ID field of the first BIQ of the operation transfer. By including this field, the functional unit that transmitted the operation that caused the data error, can notify the process of the data error.

The OPER field is copied from the OPER field of the operation transfer that caused the error.

The CNT field reflects the state of the multi-word counter when the error occurred.

The 8-bit SYNDROME field identifies the bit that was found to be in error.

The WORD ADDRESS field is the address of the word in which the error occurred.

The E Bit is set to 1 in the first BIQ to notify the originator of the operation transfer that the data transfer that it generated had an error. The E bit of the second BIQ is set to 0 if the error was correctable, and it is set to 1 if it was uncorrectable.

The Invalid Operation Response is a 2-BIQ transfer that is issued by a device upon receipt of an invalid operation (an operation that the device does not recognize or is incapable of performing). The first BIQ of the response contains the error information, and the second BIQ contains a copy of the first BIQ of the operation that caused the error. The OPER field contains 1111, so that the functional unit that receives the response can distinguish it from a Data Error Response. The format is as follows:

| Chip No.: | ←0→ ←1→ | | ←2→ | | | | ←3→ | | ←4→ | |
|---|---|---|---|---|---|---|---|---|---|---|
| BIQ #1 | PROCESS ID | |1111| | U | |A| | C | |·| | ERRDSCRPT | ----- | ... |
| BIQ #2 | | | | | | | | COPY OF FIRST | | |
| Bit. Num.: | 0000000000111111 | 1111 | 2 | 2 | 2 | 2 | 22222233 | | 33333333 | |
| | 0123456789012345 | 6789 | 0 | 1 | 2 | 3 | 45678901 | | 23456789 | |
| | ←4→ ←6→ ←7→ | | | ←8→ | | | ←9→ | | ←10→ | |
| ... | | |FSLOT| | TAG | |SPRE| | 001 | |1| | TSLOT | |P| 0| |
| ... | BIQ OF OPERATION | |FSLOT| | TAG | |SPRE| | 101 | |1| | TSLOT | |P| 0| |
| | 4444444444555555555566666 | 66666 | 677 | 7777 | 777 | 7 | 888888 | 8 | 8 | |
| | 0123456789012345678901234 | 45678 | 901 | 2345 | 678 | 9 | 012345 | 6 | 7 | |

The PROCESS ID field is copied from the first BIQ of the invalid operation transfer, and indicates the process that caused the invalid operation to occur.

The U bit is set to 1 if the Operation specified one of the undefined OPER codes; otherwise, it is 0.

The A bit is set to 1 if the invalid operation attempted to access non-existent memory; otherwise, it is 0.

The C bit is set to 1 if the operation specified a multi-word operation and the CNT field exceeded the maximum CNT allowed for the device; otherwise, it is 0.

The 8-bit ERRDSCPT field informs error-monitoring hardware as to why the operation cannot be performed by the responding device, and is of device-dependent definition. However, if the error consists entirely of one or more of the "standard" error conditions, undefined OPERation, Address Fault, or Maximum Count Exceeded, then this field should be 0.

The Functional Unit Override capability discussed above is provided so that the SVP can override the operation of a functional unit and examine its operation. This might be when the unit is busy, in operation non-acknowledge mode, or has its BROKE flag set. Thus the Functional Unit Override capability must have the ability to be recognized by the unit under all circumstances. The Functional Override transfer is a 1-BIQ transfer that has the bit set, and the operation/response bit in the response mode. These two bits are "seen" by the functional unit for all bus transactions. Thus a unit can monitor the state of these lines and SLOT DETECT to determine if the SVP desires to intervene in its affairs. The format is as follows:

```
Chip No.:  <- 0  -><- 1  -><- 2  -><- 3  -><- 4  -><- 5  ->
         |----------------------------------------------------
         -----------------------------------------------------...
Bit Num.: 00000000001111111111222222222233333333334444444444
          01234567890123456789012345678901234567890123456 7

<- 6  -><- 7  -> <-  8   -> <-   9   -> <-  10->
         -----------------|FSLOT|TAG|SPRE|1 0 0 | 0 |TSLOT | 0 | 1 |
         -----------------------------------------------------
          4455555555556666 66666 677 7777 777 7 888888 8  8
          8901234567890123 45678 901 2345 678 9 012345 6  7
``` cycle 190 2, in which case BIQ #2 is placed on the bus during cycle #2, BIQ #2 is present at the receiving unit's SR register during cycle #3, the ACK signals for BIQ #2 are placed on the bus during cycle #4, and the ACK signals for BIQ #2 are available at the sending unit's (ACK) SR register during cycle #5.

System Bus Control-Transmit Circuitry

As stated above, the major portion of the SBC circuitry is implemented on a single "Macrocell" chip (PLC chip 39). The SBC chip includes transmit circuitry and receive circuitry.

The basic function of the transmit circuitry in SBC chip 39 is to provide status and timing signals to the functional unit proper during a transmit cycle, based on the ACK signals generated by the receive circuitry of the SBC chip at the receiving port. Additionally, the transmit circuitry controls the select A input to transmit select circuitry 175 is the SBT slices during certain 2-BIQ transmissions, thus overriding the functional unit's control.

Prior to describing the particular circuitry for implementing these functions, it is helpful to consider the sequence of events in a transmit cycle. FIG. 14 is a timing diagram illustrating the BIQ and ACK bus activity and the BIQ and ACK SR register state. For convenience, the cycles will be numbered from the first cycle for which GRANT is high at the rising edge of TCLK. As described above, GRANT is sent high sometime prior to the rising edge of TCLK for the cycle in which the unit has been granted the use of the bus, and remains high until some time after that TCLK rising edge, or the TCLK rising edge following that if two successive bus cycles are to be granted. The sequence is as follows.

Cycle #1. The sending unit causes BIQ #1 (as stored in the selected A- or B-register) to be placed on the bus, where it remains for the remainder of the cycle.

Cycle #2. Shortly after the rising edge for cycle #2 (but before the removal of BIQ #1 from the bus has propagated from the sending unit) the receiving unit strobes the bus contents into its SR register. It is during this cycle that the receive circuitry in the SBC chip for the receiving unit must determine the appropriate ACK code to send back.

Cycle #3. The receiving unit places the ACK signals on the ACK bus where they remain for the remainder of the cycle.

Cycle #4. The sending unit strobes the ACK bus shortly after the rising edge of TCLK (but before the removal of the ACK signals from the ACK bus has propagated from the receiving unit) into its (ACK) SR register for processing by the SBC transmit circuitry.

For a 2-BIQ transfer, GRANT remains high throughout cycle #1 and until after the rising edge beginning cycle 190 2, in which case BIQ #2 is placed on the bus during cycle #2, BIQ #2 is present at the receiving unit's SR register during cycle #3, the ACK signals for BIQ #2 are placed on the bus during cycle #4, and the ACK signals for BIQ #2 are available at the sending unit's (ACK) SR register during cycle #5.

FIG. 15A is a logical schematic of transmit cycle timing circuitry 250. Transmit timing circuitry 250 comprises a shift register provided by a chain of five sequentially connected flip-flops 252a–e with the GRANT signal communicated to the data input of flip-flop 252a. The flip-flops are clocked on the rising edge of TCLK. It will be appreciated that the state of GRANT at a given rising edge will be propagated through the chain of flip-flops, and the outputs will reflect the bus activity and SR register state as shown in FIG. 14 and described above. Thus the output of flip-flop 252a, designated BIQ ON BUS, remains high during the cycle(s) for which GRANT was high at the rising edge. The output of flip-flop 252b lags the output of flip-flop 252a and signifies when the transmitted BIQ or (BIQ's) is in the receiving unit's SR register. The output of flip-flop 252c, designated ACK ON BUS, remains high during the cycle(s) that the ACK signals are on the ACK bus. The outputs of flip-flop 252d, designated ACK AVAILABLE and $\overline{\text{ACK AVAILABLE}}$ signify when the ACK signals are in the sending unit's SR register and are thus available for examination. The outputs of flip-flop 252e are combined with ACK AVAILABLE at a gate 255 to generate an ACK CYCLE COMPLETE signal, and with ACK ON BUS and ACK AVAILABLE at a gating network 257 to provide signals for the functional unit indicating when it is to strobe the ACK lines. These signals are designated STROBE ACK #1 and $\overline{\text{STROBE ACK #2}}$ for the ACK signals corresponding to the first and second BIQ's of a 2-BIQ transfer.

FIG. 15B is a logical schematic of ACK decoding circuitry 260 and busy latch circuitry 265 for generating a number of internal signals on the basis of the received ACK signals. More specifically, ACK decoding circuitry 260 includes a binary decoder 267 having output lines corresponding to the nonzero values for the ACK code. A five input NOR GATE 270 produces an internal signal, designated $\overline{\text{TRANSMIT ERROR}}$, if the ACK signals had a parity error, if the ACK signals indicated that the transmitted data was received with a parity error, if there was not ACK bus activity when expected, if the receiving unit was broken, or if the receiving unit was busy and the specified number of retries has been made. Busy latch circuitry 265 correlates detection of a busy condition with the STROBE ACK signals to generate internal signals, designated BUSY FOR BIQ 1 and BUSY FOR BIQ 2.

FIG. 15C is a logical schematic of transmit status circuitry 275. Transmit status circuitry 275 includes a flip-flop 277 for generating an XMIT IN PROGRESS signal to inform the functional unit proper that a transmission by the port logic control is in progress. Flip-flop 277 is set when the TRANSMIT signal from the functional unit is raised, and remains set until the transmission has been successfully sent (ACK=00) or until an error occurs. If the transmission is non-acknowledged due to a full or busy condition at the receiving functional unit, XMIT IN PROGRESS remains high unless RETRY EXH is active. If the transmission is not to be retried, XMIT IN PROGRESS becomes inactive. The circuitry also includes a flip-flop 280 for generating an XMIT ERROR signal used to inform the functional unit that an error has occurred during the last transfer on the bus. This line is valid when XMIT IN PROGRESS falls. A flip-flop 282 is set when a busy condition occurs, and generates an $\overline{\text{INC RETRY}}$ signal to cause a retry counter (off the SBC chip) to be incremented. When the retry counter reaches a predetermined value, RETRY EXH is set.

FIG. 15D is a logical schematic of circuitry 290 for handling retries in the DUAL SINGLE BIQ mode where only one of the two BIQ's was accepted. The DUAL SINGLE BIQ mode is specified by the functional unit proper and signifies that two BIQ's are to be sent on successive bus cycles, although as logically separate transfers, possibly to different functional units. In such a case, if only one BIQ is accepted, it is desired to retry the other BIQ but not to retry the one that was accepted. The circuitry includes a flip-flop 292 which is set at the completion of an ACK cycle when exactly one of the two BIQs has not been accepted due to a busy condition. When flip-flop 292 is set, its output controls an AND gate 283 which has the effect of overriding the TRANSMIT 2 signal from the functional unit, so that on the retry, only one bus cycle will be requested. A flip-flop 295 is set if it is BIQ 2 and not BIQ 1 that encountered a busy condition. The output of flip-flop 295 communicates to an exclusive OR gate 297 and has the effect of inverting the A/B selection, as specified by the functional unit proper, for the next cycle.

System Bus Control-Receive Circuitry

The basic functions of the receive circuitry in SBC chip 39 are to (a) manage the input (write address) and output (read address) pointers (WA0-2, RA0-1) for FIFO stack 180 within the SBT slices, and (b) to control the manner in which response and operation BIQ's are acknowledged. As discussed above, the write address pointers are provided to write select circuitry 190 within each of SBT slices 35 to determine which of the four FIFO registers is to be written into from the bus. The read address pointers are communicated to read select circuitry 195 within each SBT slice to determine which FIFO register is to be read out to the functional unit. The write and read address pointers are each two bits (0-3) and are incremented (never decremented). The write address pointer is incremented when a FIFO register is written. The read address pointer is incremented after reading a FIFO register is completed.

FIG. 16A is a logical schematic of write address (input) pointer circuitry 300 for generating the write address pointer (WA0, WA1, and WA2). The circuitry includes a 2-bit counter 305, associated with which are flip-flops 307 and 308 whose clocked values represent bits 0 and 1 of the write address pointer. However, it is necessary that the pointer output bits WA0 and WA1 be generated more quickly than is possible with counter 305. To this end, write address pointer circuitry 300 includes circuitry 310 for performing the incrementation on the basis of the state of counter 305 before it is incremented. It should be noted that the write address pointer is not incremented if it is determined (as discussed below) that the FIFO is already full, if there is only one FIFO register available for writing from the bus and the transfer is a 2-BIQ transfer, or if the BIQ is an operation BIQ and operations are not to be accepted (see below). These conditions are communicated to write address pointer circuitry 300 by internal signals designated WRITE NEXT, FULL NEXT, and FIFO FULL.

FIG. 16B is a logical schematic for circuitry for controlling the read address pointer (RA0 and RA1). As in the case of write address pointer circuitry 300, this circuitry includes a simple 2-bit counter 325 and additional circuitry 330 for performing the incrementation on the basis of the unincremented state of counter 325. The read address pointer is incremented by the receipt of a READ FIFO signal from the functional unit, as qualified by an internal enabling signal, designed EN READ FIFO.

FIG. 16C is a logical schematic of FIFO state circuitry 335 that compares the read and write address pointers to provide the following signals which flag the existence of the following conditions: (a) a signal designated RA+1=WA which, if true, indicates that the next state after a read will be that the FIFO is empty; (b) a signal designated WA+1=RA which, if true, indicates that the next state after a write will be a full FIFO; and (c) a signal designated RA=WA, which, if true, indicates that the FIFO is either full or empty.

FIG. 16D is a logical schematic of circuitry 340 responsible for determining the status on the next cycle, and ACK generation circuitry 345. An 8-wide gate 350 receives at its inputs the signals representative of the conditions that have an effect on whether the FIFO is to be written on the next cycle, and provides the WRITE NEXT signal that enables counter 305 in write address pointer circuitry 300. The following are conditions under which the write address pointers are not to be incremented (i.e., WRITE NEXT is false): (a) the WA+1=RA signal indicates that the next state after a write is full while the TERM bit indicates that the BIQ is not the final BIQ of a transmission; (b) condition (a) was true on the previous cycle and the data bus was being driven for this unit on previous cycle; (c) no valid slot address match; (d) the data bus is not being driven; (e) the PHANTOM bit is set to specify that the transmission is a phantom transmission which is not to be placed in the FIFOs (but which is to be acknowledged); (f) the BIQ is an operation BIQ and the OP NACK circuitry (to be discussed below) has specified that operations are not to be accepted; (g) the functional unit had its BROKE flag set on the previous cycle or the unit had been placed in the M BIT ONLY mode, and the M bit is not set; (h) FULL INC INHIBIT is set (set below). Circuitry 340 also generates the FULL NEXT signal by gating the WA+1=RA (full on next write) with the WRITE NEXT signal.

ACK generation circuitry 345 generates in a straightforward manner the acknowledgment code described above. Thus, ACK generation circuitry 345 receives as inputs, the BROKE signal from the functional unit (to be overridden by the M BIT ONLY signal), a signal representative of the parity of the bit, and the $\overline{\text{WRITE NEXT}}$ signal indicating a busy condition.

FIG. 16E is a logical schematic of functional unit interface circuitry 360 which generates a FIFO FULL signal and a BIQ AVAILABLE signal to inform the functional unit that a BIQ has been received in the FIFO. When the functional unit finishes reading the BIQ from the FIFO, it raises the READ FIFO line that is communicated to the read address pointer circuitry 320 to effect incrementing of the read address pointer. The BIQ AVAILABLE signal is valid whenever the FIFO read pointer is behind the FIFO write pointer.

Interface circuitry 360 includes a further feature, designed for 2-BIQ transfers, wherein the TERM bit has the effect of overriding the UNIT BUSY signal, such that it is impossible for the FIFO FULL flag to be raised in the middle of a 2-BIQ transfer. Similarly, it is impossible for the unit to become non-busy in the middle of a 2-BIQ transfer.

FIG. 16F is a logical schematic of OP NACK (operation non-acknowledge) circuitry 370. Broadly, the purpose of the circuitry is to prevent the system from getting deadlocked, and relates generally to the problem arising from the use of a FIFO register to place incoming operations and responses. A first problem arises if the FIFO becomes filled and the functional unit receives operations but has not yet received the responses necessary to process its outstanding operations. For example, a functional unit may need to perform a number of memory reads in order to carry out the already accepted operations. A second problem arises if the FIFO, while not full, becomes blocked by an operation that is placed in the FIFO stack before the responses required to process the outstanding operation. In order to access the responses, the functional unit must set aside a place to store the operation until it is in a position to use it. This is wasteful and causes the whole system to become severely degraded.

The functional unit protects itself from the above situations by controlling the state of three signals, designated BLOCK ALL OP, ACCEPT SINGLE OP, and ALLOW NEXT OP. The functional unit sets BLOCK ALL OP to signal that it is busy processing previously read operation BIQ's and does not want to receive any more operation BIQ's into its FIFO registers. Response BIQ's will still be accepted. When BLOCK ALL OP is set, circuitry 370 sets OP NACK high so that further operations will not be written to the FIFO. If the functional unit raises the ACCEPT SINGLE OP line, all operation BIQs are non-acknowledged after the last BIQ of the next operation is received. In this case, acknowledgement of operation BIQ's resumes when the ALLOW NEXT OP line is raised. The ALLOW NEXT OP input has meaning only in the ACCEPT SINGLE OP mode. For example, in the illustrative system of FIG. 2, CPU 10a, SVP 10b, and IOCP 10d would typically have ACCEPT SINGLE OP active all the time while memory controller 10c would allow an unlimited number of operations. It will be noted that the TERM bit effectively overrides the BLOCK ALL OP input so that the OP NACK signal cannot change state in the middle of a 2-BIQ operation transfer.

FIG. 16G is a logical schematic of reset and override circuitry 380 responsible primarily for generating a FUNCTIONAL UNIT OVERRIDE signal in response to a combination of the M bit high and the OPER bit low. The FUNCTIONAL UNIT OVERRIDE signal notifies the functional unit that it should respond to maintenance commands from the SVP. The functional unit does this by raising its M BIT ONLY flag. As discussed above in connection with FIG. 16D, subsequent operations with the M bit set will then be accepted, even if the unit has its BROKE flag set. The FUNCTIONAL UNIT OVERRIDE signal also generates an internal RESET signal that communicates with other portions of the SBC chip to zero the pointers and permit acknowledgment of further BIQ's. This allows subsequent operations with the M bit set to be accepted.

In summary, it can be seen that the present invention provides a very high speed bus structure, along with protocols and implementing control logic. The high speed, in combination with such features as the tag scheme and the OP NACK scheme render the present invention highly advantageous for use in a multiprocessor computer system.

While the above provides a full and complete disclosure of the preferred embodiment of the present invention, various modifications, alternate constructions, and equivalents may be employed without departing from the true spirit and scope of the invention. For example, depending on the nature of the data flow, it would also be possible to separate the receiver and transmitter within a port. Indeed, the system might include two sets of bus lines with some units having their transmitters coupled to one set and their receivers to the other. Moreover, while each information field is disclosed as having a dedicated signal line or set of signal lines, more than one field could be time-multiplexed on the same line(s). Thus, the communication medium for a particular field would then be defined by the line(s) and the time slot. Additionally, while a current mode bus is disclosed, the protocols and control logic are not limited to any particular bus medium, and would be applicable to other structures, for example, a fiber optics bus. Similarly, while the control logic is implemented in ECL, it would also be possible to implement the system in MOS. Therefore, the above description and illustration should not be construed as limiting the scope of the invention which is defined by the appended claims.

We claim:

1. In a data communication system wherein a sending unit operates to transmit information quanta to a receiving unit, a transfer consisting of either one information quantum or multiple information quanta transmitted over successive bus cycles, the improvement comprising:

means in said sending unit for communicating along with each information quantum a position field representative of the relative position of the accompanying information quantum within the transfer;

screening means is said receiving unit operative to accept or reject an information quantum; and means in said receiving unit responsive to said position field for constraining said screening means to prevent said screening means from accepting a later information quantum of a multiple-quantum transfer if said screening means rejected an earlier information quantum of the same multiple-quantum transfer.

2. The invention of claim 1 wherein said constraining means further operates to prevent said screening means from rejecting a later information quantum of a multiple-quantum transfer if said screening means accepted an earlier information quantum of the same multiple-quantum transfer.

3. The invention of claim 1 wherein said screening means is responsive to the availability of buffer space in said receiving unit.

4. The invention of claim 1 wherein transfer may comprise at most two information quanta, and wherein said relative position field includes a length flag and a terminator flag.

5. The invention of claim 4 and further comprising:
means in said receiving unit defining a register stack for storing accepted information quanta;
means in said screening means for determining when there is only one empty register in said stack; and
means in said screening means and said constraining means operative to reject an information quantum if the terminator flag indicates that the information quantum is not the final information quantum of a transfer and said screening means determines that there is only one empty register in said stack.

6. The invention of claim 1 wherein transfer may belong to either of two classes, and further comprising:
means in said sending unit for communicating along with each information quantum a classification flag representative of the class of the corresponding transfer;
means in said receiving unit responsive to said class flag;
means in said receiving unit for providing a signal signifying that information quanta of a first of said classes are to be rejected; and
means in said screening means responsive to said signal to render said screening means operative to reject information quanta of said first class, subject to the operation of said constraining means.

7. In a data communication system wherein a sending unit operates to transmit information quanta to a receiving unit, wherein a transfer may consist of either one information quantum or multiple information quanta transmitted over successive bus cycles, and wherein transfers may belong to either of two classes, the improvement comprising:
means in said sending unit for communicating along with each information quantum a position field representative of the relative position of the accompanying information quantum within the transfer;
means in said sending unit for communicating along with each information quantum a classification flag representative of the class of the corresponding transfer;
means in said receiving unit responsive to said classification flag;
means in said receiving unit for providing a signal signifying that information quanta of a first of said classes are to be rejected;
means in said receiving unit for determining the availability of buffer space to store all of the information quanta making up the transfer;
screening means in said receiving unit responsive to said signal and to the availability of buffer space for selectively accepting or rejecting an information quantum; and
means in said receiving unit responsive to said position field for constraining said screening means to prevent said screening means from accepting a later information quantum of a multiple-quantum transfer if said screening means rejected an earlier information quantum of the same multiple-quantum transfer.

8. In a data communication system wherein a first unit communicates with other units and operates to send operations and to receive responses and operations from said other units, and wherein an operation or response may include one or two information quanta, the improvement comprising:
means in each of said other units for communicating along with an information quantum a terminator flag representative of whether the accompanying information quantum is the final information quantum of the transfer;
means in each of said other units for communicating along with an information quantum a classification flag representative of whether the accompanying information quantum is an operation or a response;
screening means in said first unit responsive to said classification flag and operative to accept or reject operations while continuing to accept responses; and
constraint means in said first unit responsive to said terminator flag for preventing said screening means from accepting the second information quantum of a two-quantum operation if said screening means rejected the first information quantum of the same two-quantum operation and for preventing said screening means from rejecting the second information quantum of a two-quantum operation if said screening means accepted the first information quantum of the same two-quantum operation.

9. In a data communication system wherein a first unit communicates with other units, and operates to send operations and to receive responses and operations from said other units, an operation or response consisting of either one information quantum or multiple information quanta transmitted over successive bus cycles, the improvement comprising:
means in each of said other units for communicating along with an information quantum a position field representative of the relative position of the accompanying information quantum within the transfer;
means in each of said other units for communicating along with an information quantum a classification flag representative of whether the accompanying information quantum is an operation or a response;
screening means in said first unit responsive to said classification flag and operative to accept or reject operations while continuing to accept responses;
constraint means in said first unit responsive to said position field for preventing said screening means from accepting a later information quantum of a multiple-quantum operation if said screening means rejected an earlier information quantum of the same multiple-quantum operation and for preventing said screening means from rejecting a later information quantum of a multiple-quantum operation if said screening means accepted an earlier information quantum of the same multiple-quantum operation.

10. The invention of claim 9 wherein transfer may comprise at most two information quanta, and wherein said position field includes a length flag and a terminator flag.

11. In a data communication system wherein a sending unit operates to transmit an information quantum to a receiving unit, the improvement comprising:

acknowledgement means in said receiving unit for communicating to said sending unit an acknowledgement code representative of the success with which said information quantum was received;

register means in said receiving unit for storing information quanta;

screening means in said receiving unit for selectively accepting or rejecting an information quantum on the basis of the availability of space in said register means;

means in said receiving unit for writing an accepted information quantum into said register means;

means in said sending unit for communicating along with each information quantum a phantom flag representative of whether the accompanying information quantum defines a phantom transmission; and means in said screening means responsive to said phantom flag for preventing the accompanying information quantum from being written into said register means when said phantom flag signifies a phantom transmission, regardless of the availability of space in said register means;

said acknowledgement means being operative to communicate said acknowledgement code in response to phantom transmissions whereupon said sending unit may poll said receiving unit to verify the integrity of transmission from said sending unit to said receiving unit substantially without changing the state of said receiving unit.

12. The invention of claim 11 wherein said acknowledgement codes include a normal code, a busy code signifying the lack of availability of space in said register means, and at least one error code, and wherein said acknowledgement means acknowledges phantom transmissions with one of said codes other than said normal code.

13. In a receiving unit for use in a data communication system where a sending unit operates to transmit information quanta to the receiving unit, and wherein a transfer may belong to either of two classes, designated operations and responses, and has associated therewith a first classification flag specifying to which class the transfer belongs, and also has associated therewith a second sub-classification flag, designated the maintenance bit, the improvement comprising:

means for providing a first internal signal signifying that operations are to be rejected;

means for providing a second internal signal signifying a broken condition;

acknowledgement means for communicating to the sending unit an acknowledgement code representative of the success with which an incoming information quantum was received, said acknowledgement code being capable of signifying any of a group of conditions including normal acceptance, rejection because busy, and rejection because broken; and screening means operatively coupled to said acknowledgement means and responsive to the classification and sub-classification flags and to said first and second internal signals for selectively accepting or rejecting an incoming information quantum;

said screening means and said acknowledgement means together operating as follows (a) upon assertion of neither of said first and second internal signals, to accept incoming transfers and acknowledge normal acceptance, (b) upon assertion of said first internal signal only, to accept incoming responses and acknowledge normal acceptance, but to reject incoming operations and acknowledge rejection because busy, (c) upon assertion of said second internal signal only, to accept incoming maintenance operations and acknowledge normal acceptance, but to reject incoming non-maintenance operations and non-maintenance responses and acknowledge rejection because broken, and (d) upon assertion of both said first and second internal signals, to reject incoming maintenance operations and acknowledge rejection because busy, and to reject incoming non-maintenance operations, and non-maintenance responses and acknowledge rejection because broken.

14. The invention of claim 13 wherein an incoming transfer also has an override flag associated therewith, and further comprising:

reset means responsive to the override flag for removing said first internal signal in response to an incoming transfer having the override flag set whereupon subsequent incoming maintenance operations can be accepted by said screening means and acknowledged by said acknowledgement means as having been normally accepted.

15. The invention of claim 14 wherein the override flag is defined and considered to be set when the classification and sub-classification flags associated with an incoming transfer signify a maintenance response.

16. The invention of claim 14, and further comprising:

means operatively coupled to said screening means to provide a third internal signal in response to said incoming transfer having the override flag set;

wherein said screening means is further responsive to said third internal signal, and upon assertion of said third internal signal, operates to accept incoming transfers only if the maintenance bit is set.

17. In a receiving unit for use in a data communication system where a sending unit operates to transmit information quanta to the receiving unit, and wherein a transfer may belong to either of two classes, designated operations and responses, and has associated therewith a first classification flag specifying to which class the transfer belongs, a second sub-classification flag, designated the maintenance bit, and an override flag, the improvement comprising:

input buffer means for storing up to a predetermined number of information quanta;

buffer state means for providing a first internal signal signifying that space is unavailable in said input buffer means;

means for providing a second internal signal signifying a broken condition;

acknowledgement means for communicating to the sending unit an acknowledgement code representative of the success with which an incoming information quantum was received, said acknowledgement code being capable of signifying any of a group of conditions including normal acceptance, rejection because busy, and rejection because broken;

screening means operatively coupled to said acknowledgement means and responsive to the classification and subclassification flags and to said first and second internal signals for selective accepting or rejecting an incoming information quantum, acceptance of an information quantum causing such accepted information quantum to be stored in said input buffer means;

said screening means and said acknowledgement means together operating as follows
  (a) upon assertion of neither of said first and second internal signals, to accept incoming transfers and acknowledge normal acceptance,
  (b) upon assertion of said first internal signal only, to reject incoming transfers and acknowledge rejection because busy,
  (c) upon assertion of said second internal signal only, to accept incoming maintenance operations and acknowledge normal acceptance, but to reject incoming non-maintenance operations and non-maintenance responses and acknowledge rejection because broken, and
  (d) upon assertion of both said first and second internal signals, to reject incoming maintenance operations and acknowledge rejection because busy, and to reject incoming non-maintenance operations, and non-maintenance responses and acknowledge rejection because broken; and reset means responsive to the override flag for removing said first internal signal in response to an incoming transfer having the override flag set whereupon subsequent incoming maintenance operations can be accepted by said screening means and acknowledged by said acknowledgement means as having been normally accepted.

18. The invention of claim 17 wherein the override flag is defined and considered to be set when the classification and sub-classification flags associated with an incoming transfer signify a maintenance response.

19. The invention of claim 17, and further comprising:
  means operatively coupled to said screening means for providing a third internal signal in response to said incoming transfer having the override flag set;
  wherein said screening means is further responsive to said third internal signal, and upon assertion of said third internal signal, operates to accept incoming transfers only if the maintenance bit is set.

20. In a receiving unit for use in a data communication system wherein a sending unit operates to transmit information quanta to the receiving unit, and wherein a transfer consists of either one information quantum or multiple information quanta transmitted over successive bus cycles, the improvement comprising:
  means for providing a position field representative of the relative position of an incoming information quantum within a transfer;
  screening means operative to accept or reject an information quantum; and
  means responsive to said position field for constraining said screening means to prevent said screening means from accepting a later information quantum of a multiple-quantum transfer if said screening means rejected an earlier information quantum of the same multiple-quantum transfer.

21. The invention of claim 20 wherein said constraining means further operates to prevent said screening means from rejecting a later information quantum of a multiple-quantum transfer if said screening means accepted an earlier information quantum of the same multiple-quantum transfer.

22. The invention of claim 20 wherein said screening means is responsive to the availability of buffer space in said receiving unit.

23. The invention of claim 20 wherein transfers may comprise at most two information quanta, and wherein the position field includes a length flag and a terminator flag.

24. The invention of claim 23, and further comprising:
  means defining a register stack for storing accepted information quanta;
  means in said screening means for determining when there is only one empty register in said stack; and
  means in said screening means and said constraining means operative to reject an information quantum if the terminator flag indicates that the information quantum is not the final information quantum of a transfer and said screening means determines that there is only one empty register in said stack.

25. The invention of claim 20 wherein a transfer may belong to either of two classes, and further comprising:
  means for providing a classification flag representative of the class of an incoming information quantum;
  means in said receiving unit for providing a signal signifying that information quanta of a first of said classes are to be rejected; and
  means in said screening means responsive to the classification flag and to said signal to render said screening means operative to reject information quanta of the first class, subject to the operation of said constraining means.

26. In a receiving unit for use in a data communication system wherein a sending unit operates to transmit information quanta to the receiving unit, wherein a transfer may consist of either one information quantum or multiple information quanta transmitted over successive bus cycles, and wherein a transfer may belong to either of two classes, the improvement comprising:
  means for providing a position field representative of the relative position of an incoming information quantum within a transfer;
  means for providing a classification flag representative of the class of the transfer;
  means responsive to the classification flag;
  means for providing a signal signifying that information quanta of a first of said classes are to be rejected;
  means for determining the availability of buffer space to store all of the information quanta making up the transfer;
  screening means responsive to said signal and to the availability of buffer space for selectively accepting or rejecting an information quantum; and
  means responsive to the position field for constraining said screening means to prevent said screening means from accepting a later information quantum of a multiple-quantum transfer if said screening means rejected an earlier information quantum of the same multiple-quantum transfer.

27. In a receiving unit for use in a data communication system wherein the receiving unit communicates with other units and operates to receive responses and operations from the other units, and wherein an operation or response may include one or two information quanta, the improvement comprising:

means for providing a terminator flag representative of whether an incoming information quantum is the final information quantum of a transfer;

means for providing a classification flag representative of whether an incoming information quantum is an operation or a response;

screening means responsive to the classification flag and operative to accept or reject operations while continuing to accept responses; and constraint means responsive to the terminator flag for preventing said screening means from accepting the second information quantum of a two-quantum operation if said screening means rejected the first information quantum of the same two-quantum operation and for preventing said screening means from rejecting the second information quantum of a two-quantum operation if said screening means accepted the first information quantum of the same two-quantum operation.

28. In a receiving unit for use in a data communication system wherein the receiving unit communicates with other units, and operates to receive responses and operations from the other units, wherein an operation or response may consist of either one information quantum or multiple information quanta transmitted over successive bus cycles, the improvement comprising:

means for providing a position field representative of the relative position of an incoming information quantum within a transfer;

means for providing a classification flag representative of whether an incoming information quantum is an operation or a response;

screening means responsive to the classification flag and operative to accept or reject operations while continuing to accept responses; and constraint means responsive to the position field for preventing said screening means from accepting a later information quantum of a multiple-quantum operation if said screening means rejected an earlier information quantum of the same multiple-quantum operation and for preventing said screening means from rejecting a later information quantum of a multiple-quantum operation if said screening means accepted an earlier information quantum of the same multiple-quantum operation.

29. The invention of claim 28 wherein transfers may comprise at most two information quanta, and wherein the position field includes a length flag and a terminator flag.

30. In a receiving unit for use in a data communication system wherein a sending unit operates to transmit an information quantum to the receiving unit, the improvement comprising:

means for providing a phantom flag representative of whether an incoming information quantum defines a phantom transmission;

acknowledgement means for communicating to the sending unit an acknowledgement code representative of the success with which the information quantum was received;

register means for storing information quanta;

screening means for selectively accepting or rejecting an information quantum on the basis of the availability of space in said register means;

means for writing an accepted information quantum into said register means; and means in said screening means responsive to the phantom flag for preventing the accompanying information quantum from being written into said register means when the phantom flag signifies a phantom transmission, regardless of the availability of space in said register means;

said acknowledgement means being operative to communicate said acknowledgement code in response to phantom transmissions whereupon the sending unit may poll said receiving unit to verify the integrity of transmission from the sending unit to said receiving unit substantially without changing the state of said receiving unit.

31. The invention of claim 30 wherein said acknowledgement codes include a normal code, a busy code signifying the lack of availability of space in said register means, and at least one error code, and wherein said acknowledgement means acknowledges phantom transmissions with one of said codes other than said normal code.

* * * * *